(12) United States Patent
Maruyama et al.

(10) Patent No.: US 7,276,924 B2
(45) Date of Patent: Oct. 2, 2007

(54) ELECTRICAL CONNECTING METHOD

(75) Inventors: Shigeyuki Maruyama, Kawasaki (JP); Toru Nishino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/937,401

(22) Filed: Sep. 10, 2004

(65) Prior Publication Data

US 2005/0253614 A1    Nov. 17, 2005

(30) Foreign Application Priority Data

May 13, 2004    (JP) ............... 2004-143742

(51) Int. Cl.
*G01R 1/073*    (2006.01)
*G01R 31/02*    (2006.01)

(52) U.S. Cl. ..................... 324/757; 324/760

(58) Field of Classification Search ............ None
See application file for complete search history.

(56) References Cited

U.S. PATENT DOCUMENTS

| | | | |
|---|---|---|---|
| 5,440,239 A * | 8/1995 | Zappella et al. | 324/757 |
| 5,966,022 A * | 10/1999 | Budnaitis et al. | 324/760 |
| 6,091,251 A * | 7/2000 | Wood et al. | 324/755 |
| 6,121,576 A * | 9/2000 | Hembree et al. | 219/209 |
| 6,337,575 B1 * | 1/2002 | Akram | 324/760 |
| 6,614,003 B2 * | 9/2003 | Hembree et al. | 219/209 |

FOREIGN PATENT DOCUMENTS

| | | |
|---|---|---|
| JP | 7-12892 | 1/1995 |
| JP | 11-23656 | 1/1999 |
| JP | 11-97497 | 4/1999 |
| JP | 11-133075 | 5/1999 |

\* cited by examiner

*Primary Examiner*—Ernest Karlsen
(74) *Attorney, Agent, or Firm*—Westerman, Hattori, Daniels & Adrian, LLP.

(57) ABSTRACT

An electrical connecting method has the step of bringing a contact member connected to an electric circuit into contact with a terminal of an electronic part. A desired processing is performed by feeding current to the terminal via the contact member. The contact member is then separated from the terminal. When the contact member is brought into contact with the terminal, energy is applied to the contact member or the terminal in order to locally soften a portion of the terminal contacting the contact member. Thereafter, the desired processing is performed, in the state that the contacting portion of the terminal with the contact member is softened so as to reduce the contact resistance and so as to increase the subsequent separatability of the contact member from the terminal.

10 Claims, 25 Drawing Sheets

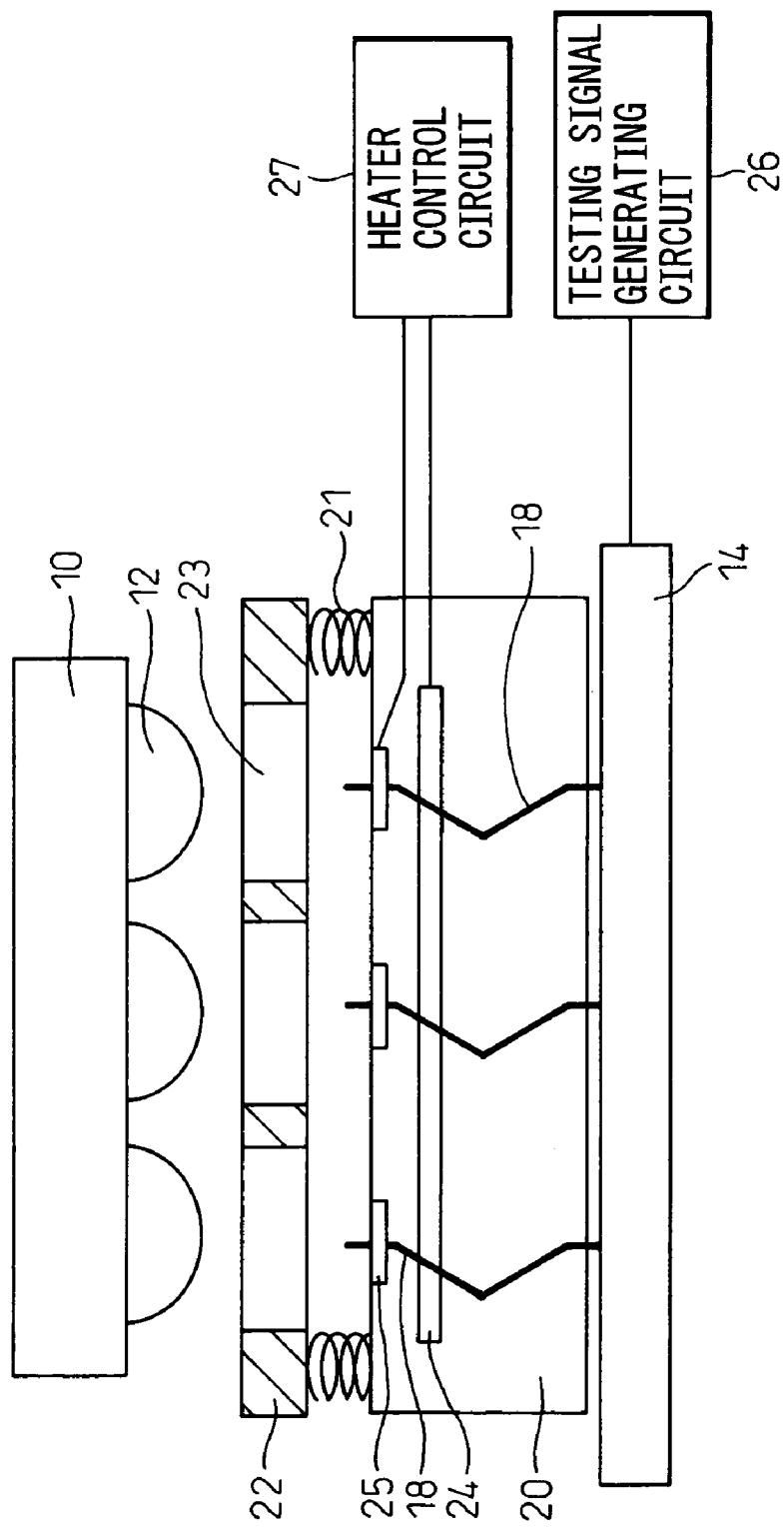

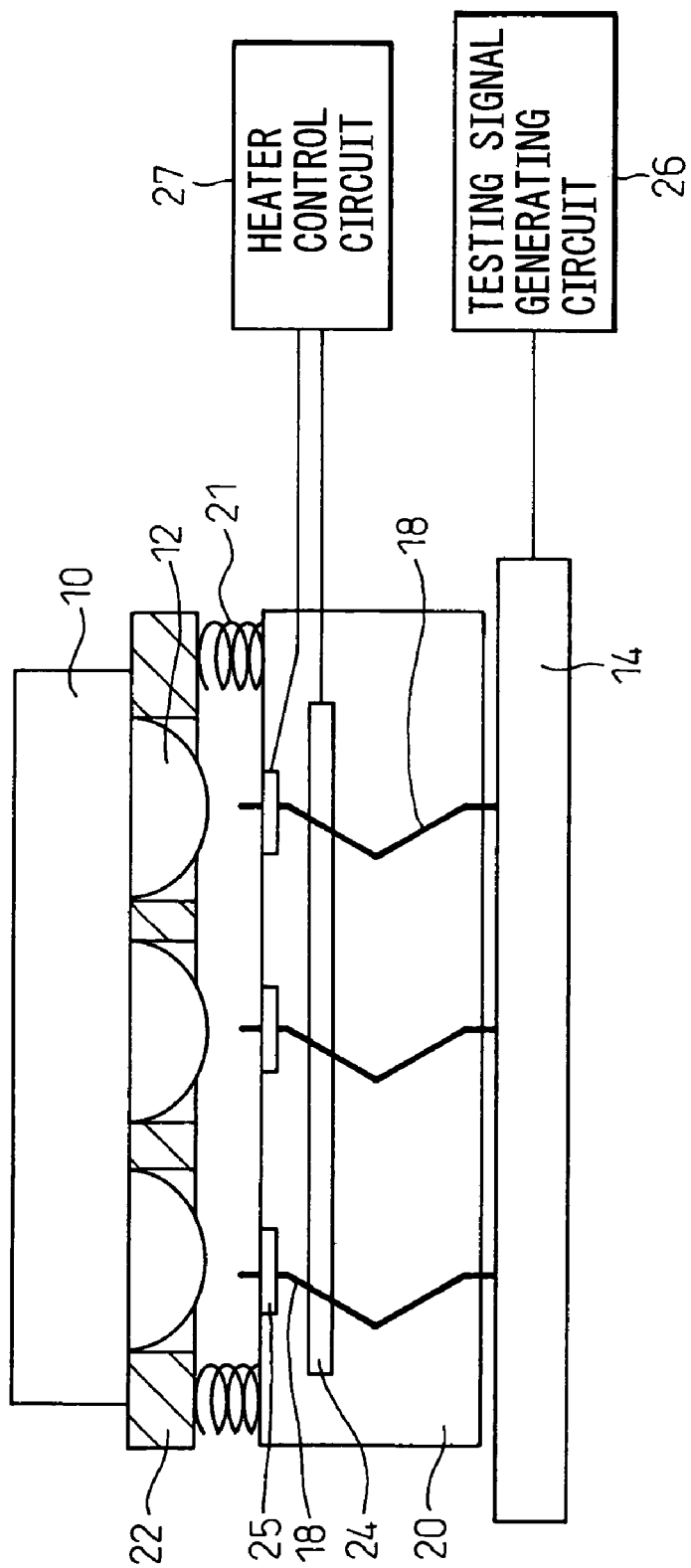

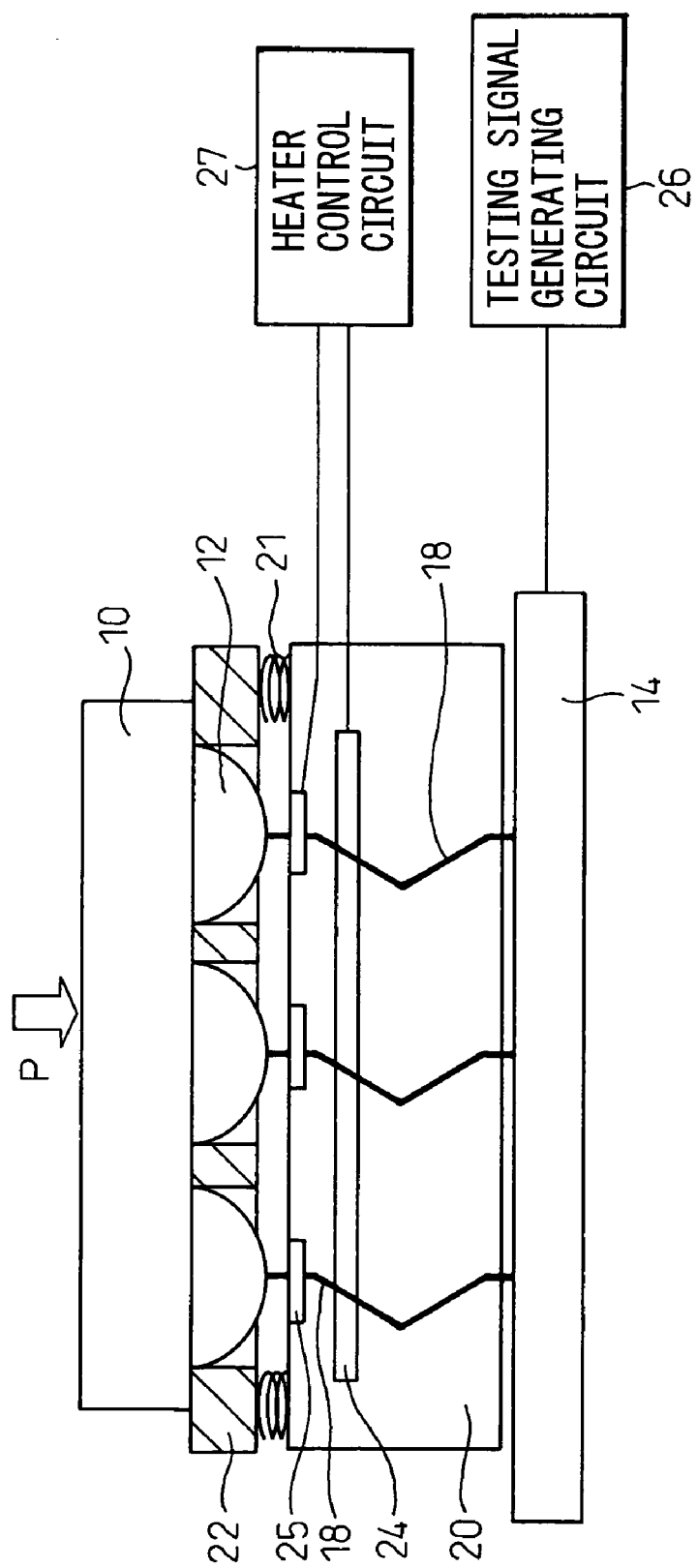

ELECTRICAL CONNECTING METHOD

BACKGROUND OF THE INVENTION

1. Field of the Invention

The present invention relates to an electrical connecting method.

2. Description of the Related Art

In a test of an electronic part having numerous fine terminals, such as an LSI wafer, an LSI chip, a chip-size package (CSP), or a semiconductor device, contact members (testing contact members) connected to an electric circuit included in a testing equipment are electrically connected to the terminals of the electronic part. Voltage is applied or current is fed to the terminals of the electronic part via the testing contact members whereby the electronic part is tested.

Moreover, contact members connected to the electric circuit are electrically connected to terminals of an electronic part such as a semiconductor device having an information storage/preservation facility, whereby information is written in the electronic part or read therefrom.

For connecting the terminal of an electronic part to the terminal of a circuit board, a mechanical/electrical connecting method through soldering has been adopted as a stable connecting means in the past.

However, as the connection through soldering is a permanent connection, the solder must be removed for separation.

Therefore, the connecting method through soldering is hardly adapted to temporary connection that is performed in a case where, after an electronic part is tested or information is written in or read from the electronic part, the contact members are separated from the terminals of the electronic part.

Therefore, in the test of an electronic part or writing or reading of information, a pressing connection, via a socket that is a temporary connection, is generally performed.

In this case, contacts members in the socket are merely physically and mechanically thrust onto the terminals of an electronic part, so electrical conductance depends on the state of the interface between a contact member and a terminal.

Specifically, the possibility that there is a high resistance film between a contact member and a terminal which are touching each other is very high because the surfaces of the contact member and/or the terminal may be coated with an oxide or a contaminant. Moreover, the surfaces of the contact member and the terminal have microscopic irregularities. Electrical connecting is achieved through the contact between the microscopic convex parts (projections) of the surfaces. Therefore, the substantial area of the contacting portion of the surfaces are so small as to cause a high constriction resistance.

The film resistance and the constriction resistance substantially dominate the contact resistance occurring at the time of the temporary connection achieved through pressing.

Conventionally, a method is adopted in which a contact pressure is increased in order to break the film on the surface of a terminal and/or the surface of a contact member for the purpose of minimizing the adverse effect of the film resistance; and the area of the contacting portion of the surfaces are increased in order to reduce the constriction resistance occurring on the interface between the contact member and the terminal.

Japanese Unexamined Patent Publication No. 11-133075 discloses an electric characteristic measuring equipment in which two contact probes contact one electrode pad.

According to the above related art, one of the contact probes is fixed to a ground potential, and voltage is applied to the other contact probe. The contact resistance occurring between the electrode pad and contact probe is then measured. If the contact resistance does not assume a proper value, electric characteristic measurement is suspended. If the contact resistance assumes a proper value, the electric characteristic measurement is continued.

Japanese Unexamined Patent Publication No. 7-012892 discloses a semiconductor device inspection method in which an insulating film is layered on a testing circuit board and is provided with a pocket that encloses electrodes formed on the testing circuit board.

The terminals of a semiconductor device are formed with solder bumps. The solder bumps are inserted into the pocket of the testing circuit board while being heated and fused. The terminals of the semiconductor device are plastically deformed in line with the shape of the pocket while contacting the electrodes on the testing circuit board. Consequently, stable electrical connection is achieved with a small pressing force.

However, in the foregoing contacting method, the solder bumps are fused and bonded to the electrodes on the circuit board. It is therefore hard to separate the solder bumps from the electrodes.

Japanese Unexamined Patent Publication No. 11-023656 discloses an IC inspection method that requires a semiconductor device, a testing board having electrode pads formed on the top thereof in the same pattern as the terminals of the semiconductor device, and having probe contacting electrode pads formed on the bottom thereof, and a testing equipment having testing probes.

The electrode pads on the testing board are smaller than the terminals of the semiconductor device, and protrude from the surface of the testing board so as to contact the terminals of the semiconductor device.

However, even in the foregoing contacting method, a large pressing force is needed in order to reduce a film resistance and a constriction resistance.

Japanese Unexamined Patent Publication No. 11-097497 discloses a semiconductor inspection jig that has an opening in association with solder balls formed on a semiconductor device, and has two contact members fixed to be opposed to each other within the opening. The solder balls are inserted into the openings of the semiconductor inspection jig and thus each solder ball contacts two contacts.

According to the foregoing related art, the contact members contact the solder balls over relative large area while being unaffected by a difference between the heights of the solder balls. Each of the contact members pushes away an oxide or dust present on the surface of each of the solder balls, whereby a film resistance is lowered. As the surface of the contact member moves on the surface of the terminal, the area of the actual contacting portion of the surfaces increases to decrease a constriction resistance. Consequently, an electric contact resistance is reduced.

However, in the foregoing related art, a contact pressure ranging from 0.2 N to 0.3 N must be imposed on each terminal.

In order to prevent environmental contamination, the material to be made into terminal is changing from a solder containing lead (Pb) to a solder devoid of lead (a lead-free solder).

Terminals to be made of the lead-free solder exhibit a high hardness. In order to achieve a stable electrical contact according to the related art, when the terminals are formed with solder balls whose diameters are 0.3 mm or more, a contact pressure ranging from 0.3 N to 0.4 N must be imposed on each terminal.

Consequently, for a low resistance between each of the terminals of an LSI chip made of a lead-free solder and each of the contact members in a socket included in the inspection equipment, and for a stable electrical contact of the terminals and contact members, assuming that the number of terminals on the LSI chip is about 1000, a total pressure ranging from 300 N to 400 N or more must be applied.

On the other hand, the LSI chip is provided in the form of a so-called chip-size package (CSP) whose outer dimension including that of a sealing member is close to that of the LSI chip. This is intended to enable high-density mounting of the LSI chip in the electronic equipment. Moreover, a semiconductor substrate used to form the LSI chip is made thinner. Thus, there is a trend toward a more compact design.

A ball grid array (BGA) or a land grid array (LGA) is being adopted as a structure for external connection terminals of a container or package enclosing an LSI chip or of a substrate supporting the LSI chip. Along with the tendency toward high-density integration or sophistication of an LSI chip, a larger number of external connection terminals (or pins) is requested. A semiconductor device having 1000 or more external connection terminals has made its debut.

On the other hand, as a means for high-density mounting, a method of layering a plurality of LSI chips on one another or layering LSI chips with a supporting substrate between adjoining ones has come to be adopted.

Such a structure having LSI chips mounted thereon highly densely has little durability to an extraneous force. When a large pressure like the aforementioned one is applied, there is a fear that the LSI chips may be cracked.

Consequently, a force to be imposed on an electronic part for the purpose of connecting the terminals of the electronic part to contact members must be minimized.

Moreover, when a contact pressure is increased so that a larger force will be imposed on an electronic part, it becomes necessary to improve the strength of a socket and that of a testing board. This invites an increase in a cost.

SUMMARY OF THE INVENTION

There is a demand for a connecting method in which, when contact members and electrodes of an electronic part contact each other, a pressing force to be applied to both the contact members and the electrodes is reduced in order to minimize the damage to the electronic part and to the terminals of the electronic part a constriction resistance and a film resistance are minimized so that low-resistance connection can be achieved on a stable basis and after a test or any other desired treatment is completed, the contact members and the electrodes of the electronic part can be readily separated from each other.

The present invention provides an electrical connecting method and an electronic part testing method, in which, when contact members connected to an electric circuit included in a testing equipment or the like are electrically connected to terminals of an electronic part, the electrical connection can be reliably achieved using a relatively small pressing force with a low resistance between each of the contact members and each of the terminals and when the contact members are separated from the terminals, they can be readily separated from each other. Moreover, the present invention provides a method of writing information in an electronic part, or deleting or reading information from an electronic part.

An electrical connecting method in accordance with the present invention is characterized in that, when contact members connected to an electric circuit are brought into contact with terminals of an electronic part, energy is applied in order to locally soften a portion of the terminal contacting the contact member, current is fed to flow through the contact member and the terminal in order to perform a predetermined work and the contact members are separated from the terminals after the completion of the work.

An electronic part testing method, in accordance with the present invention, is characterized in that testing contact members are brought into contact with terminals of an electronic part, energy is applied in order to locally soften a portion of the terminal of the electronic part contacting the testing contact member, current is fed to flow through the terminal of the electronic part and the testing contact member in order to test the electronic part and the testing contact members are finally readily separated from the terminals.

Namely, according to the present invention, energy is selectively applied to the contacting portion of the contact member and the terminal of an electronic part in order to locally soften at least the surface of the portion of the terminal of the electronic part contacting the contact member.

Incidentally, an electronic part whose terminals are softened with current applied for a test or an action is too low in quality to withstand actual use. A material that will not be softened is selected and made into the terminals to be used actually.

According to the present invention, energy different from current to be applied for a test or an action is applied to the terminals of an electronic part via contacts. The surface of the terminal contacting the contact member is thus softened in order to substantially increase the area of the contacting portion of the contact member and terminal. Thus, a constriction resistance on the interface between a contact member and a terminal is reduced in order to minimize a contact resistance between them.

Energy is applied to the contact member before or after the contact member is physically contacted to the terminal of the electronic part.

Specifically, when energy is applied in advance, the contact member that is heated to have the temperature raised is contacted to the terminal of the electronic part. Otherwise, when the contact member and the terminal of the electronic part contact each other, if energy is applied to the contact member in order to heat the contact member or raise the temperatures of the contact member, the terminal of the electronic part contacting the contact member is heated. Consequently, part of the surfaces of the terminal of the electronic part is softened.

In either case, energy is applied temporarily. The portion of the terminal of the electronic part contacting the contact member is partly and selectively heated. Thus, part of the surface of the terminal is softened.

When the surface of the terminal of the electronic part is softened, if a pressing force is applied to the contact member and the terminal of the electronic part, the area of the contacting portion of the terminal of the electronic part and the contact member substantially increase. Consequently, despite the relatively small pressing force, the contact member and the terminal of the electronic part are electrically connected with a little contact resistance between the contact member and the terminal.

Moreover, as an oxide or any other film formed on the surface of the terminal contacting the contact member is softened, the film is broken with a small pressing force. Consequently, the contact member readily invades into a gap below the film and contacts the metallic part of the terminal. Eventually, electrical connection is achieved reliably while hardly being affected by a film resistance.

Consequently, according to the present invention, efficient electrical connection can be realized with a relatively small pressing force.

A contact member and the terminal of an electronic part are electrically connected to each other with part of the surfaces of the terminal of the electronic part locally softened and contacting the contact. Therefore, a bonding strength of the terminal of the electronic part relative to the contact member is smaller than that required when soldering or any other mechanical connecting method is adopted.

Consequently, after a test or any other desired work is completed, the contact member and the terminal of the electronic part can be readily separated from each other by releasing the pressing force from both of them.

According to the present invention, a heater may be used as a means for applying energy.

The heater is located near the tip of the contact member in order to rapidly heat the tip of the contact member.

The contact member may be heated before or after the contact member and the terminal of the electronic part are physically contacted.

As a result of heating the tip of the contact member, the heat is conveyed from the contact member to the terminal of the electronic part. The contacting portion of the terminal and the contact member is softened. At this time, the temperature and time are set to values not inviting deformation of the terminal.

Assuming that the electronic part is provided in the form of a CSP, after the contact member and the terminal of the CSP are contacted, the contact member may be heated. Alternatively, after the contact member is heated, the terminal of the CSP may be contacted to the contact member. In either case, when a small pressure that ranges from 0.03 N to 0.04 N and is about a one-tenth of the pressure required by the related arts is merely applied to the terminal, the electrical connection can be achieved with a smaller contact resistance between the contact member and the terminal.

The terminal of the electronic part is softened and closely contacts the contact member. If a plating material that does not cause a metallic bond relative to the material made into the terminal is adopted as a material with which the surface of the contact member is plated, unnecessary bonding between the contact member and terminal can be avoided. For example, when the material to be made into the terminal is a solder, the surface of the contact member made of a steel alloy or a carbon tool steel (SK) is plated with a material composed mainly of an element of the platinum group, such as, platinum, rhodium, ruthenium, or palladium. Thus, adhesion of the solder to the contact member can be prevented or minimized.

A testing circuit or any other electric circuit connected to the contact member is actuated with the contact member and the terminal of the electronic part contact with a low resistance between the contact member and the terminal, whereby a test or any other desired processing is performed on the electronic part.

After the processing is completed, the contacts member is separated from the terminal of the electronic part.

As a means for applying energy so as to heat the contact member, Joule heat evolved when current flows through contact members that contact one terminal of the electronic part may be used to soften the portion of the terminal contacting the contact member.

According to the above means, no heating mechanism is needed. Compared with heating to be performed using the heater, the structure of the contacts member can be simplified. Consequently, as the restrictions put on the structure decrease, the freedom in application expands.

In this case, each of the terminals of the electronic part contacts the contact members and conducted electricity to prevent current for heating may flowing through the terminals of the electronic part. Thus, low-resistance contact between the contacts and each of the terminals is realized.

A resistance exhibited by the contact members contacting one terminal is detected. If a contact resistance between the terminal and contact members becomes equal to or lower than a predetermined resistance, a test or any other desired processing is performed. At this time, a temperature detection element is used to monitor the temperature of the vicinity of each of the contacts so that the processing can be performed within a range of temperatures not causing deformation of the touching terminal.

As a means for applying energy to the contact member, in addition to heating using a heater or utilization of Joule heat, the means described below can be adopted.

(a) Heating through electromagnetic induction that causes alternating current to flow through the contact member.

(b) Irradiation of laser light to the tip of the contact member and/or to the vicinity of the contacting portion of the contact member and the terminal.

BRIEF DESCRIPTION OF THE DRAWINGS

FIG. 5 is a view illustrating constitution and the operation of an embodiment;

FIG. 6 is a view illustrating the constitution and the operation of the embodiment;

FIG. 7 is a view illustrating the constitution and the operation of an embodiment;

DESCRIPTION OF THE PREFERRED EMBODIMENTS

Embodiments of the present invention will now be described with reference to the drawings.

The fundamental arrangement of an electrical connecting method in accordance with the present invention will be described in conjunction with the connecting structure for connecting the terminal of an electronic part to a contact member connected to an electric circuit, shown in FIG. 1, and a flowchart, shown in FIG. 2.

Figure 1:
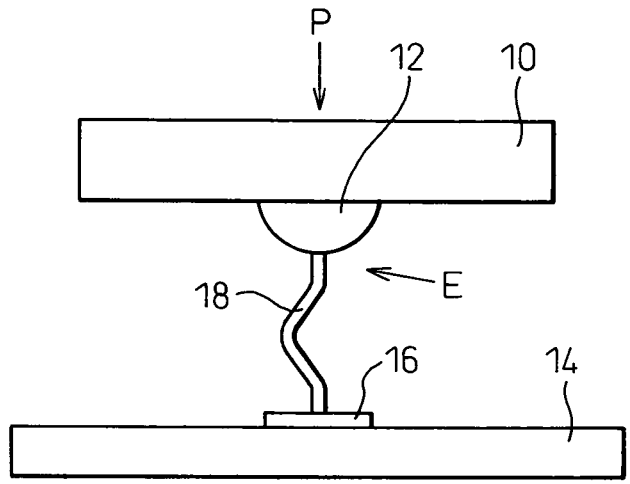
FIG. 1 shows an example of an electronic part having terminals and contact members connected to an electric circuit.

In FIG. 1, an electronic part 10 is an LSI chip having an external connection terminal (hereinafter terminal) 12 comprising a bump electrode.

The LSI chip 10 has a plurality of terminals, but only one terminal 12 is shown in FIG. 1.

Also, a circuit board 14 connected to a predetermined electric circuit (not shown) has a plurality of electrode pads formed thereon, but only one electrode pad 16 is shown.

Furthermore, a contact member (a plurality contact members) 18 is (are) mechanically supported by a supporting structure that is not shown, and both ends of the contact member 18 are brought into contact with the terminal 12 and the electrode pad 16, respectively, and thus, the contact member 18 electrically connects the terminal 12 to the electrode pad 16.

Figure 2:
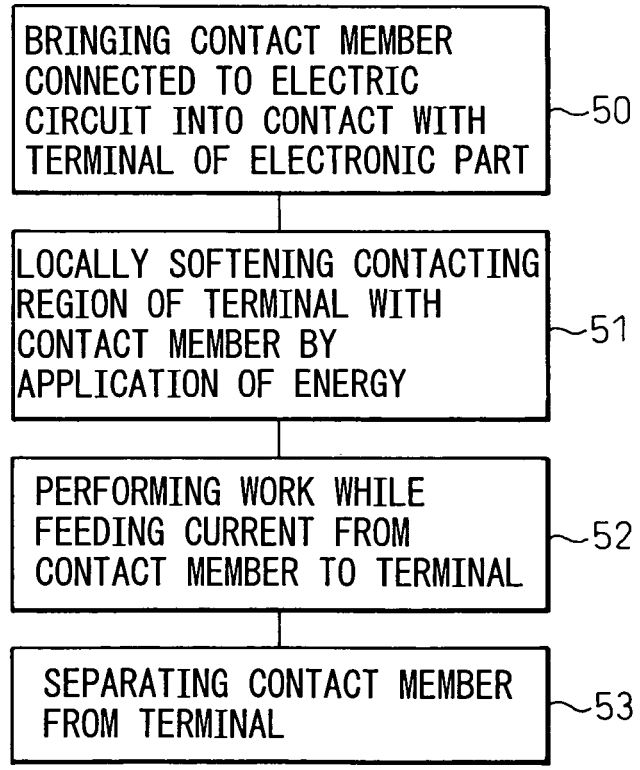
FIG. 2 is a flowchart explaining the principle of an electrical connecting method according to the present invention.

According to the present invention, first, the contact member 18 connected to the electric circuit 14 is brought into contact with the terminal 12 of the electronic part 10 (step 50 in FIG. 2).

The contact member 18 is brought into contact with the terminal 12 of the electronic part 10, and the LSI chip 10 is pressed to the electric circuit 14, as indicated by the arrow P.

Thereafter, energy is applied to the vicinities of the contacting region of the terminal 12 with the contact member 18 (arrow E) in order to locally soften the surface of the terminal 12 (step 51).

Energy is applied locally for a short period of time, and after the contact member 18 is electrically stably connected to the terminal 12, the application of energy is stopped.

Incidentally, in the state in which the contact member 18 and terminal 12 reliably contact each other, the contact member 18 and terminal 12 may be, if necessary, cooled to an ambient temperature adapted to a test or any other processing.

Thereafter, voltage and/or current is applied to the terminal 12 via the contact member 18 to perform a test or any other predetermined work on the LSI chip (step 52).

Thereafter, the contact member 18 is separated from the terminal 12 (step 53).

According to the present invention, energy may be applied before or after the contact member 18 physically contacts the terminal 12 of the electronic part 10.

In either case, in the state in which the contact member 18 contacts the terminal 12 of the LSI chip 10, energy application, such as heating, is locally performed at the contacting portion of the contact member 13 and terminal 12, so that a portion of the surface of the terminal 12 contacting the contact member 13 is softened. As a result of softening of the surface of the terminal 12, the contacting area of the terminal and contact member substantially increases, and contacting condition with a low resistance between the terminal and the contact member is established.

Moreover, according to the present invention, since the surface of the terminal 12 of the electronic part 10 is softened by the application of energy, a film such as an oxide film formed on the surface of the terminal 12 of the electronic part 10 can be broken with a smaller pressing force, compared with the case when no energy is applied, that is, the surface of the terminal is at normal temperature, and the contacting force between the surfaces of the terminal 12 and the contact member 18 is enhanced.

Consequently, the contacting condition between the terminal of the electronic part and the contact member is established, in which film resistance and constriction resistance are very small.

Therefore, desired work can be performed in the state in which the contact member 18 and terminal 12 are electrically stably contact each other with a relatively small pressing force, that is, a pressing force ranging from a one half to a one-fiftieth of a conventionally required force.

Also, as the terminal 12 of the electronic part 10 and the contact member 18 are mechanically in contact with each other and thus electrically connected to each other in the state in which a portion of the terminal 12 of the electronic part 10 is locally softened, a force required for separation is much smaller than that required when soldering is adopted, and the terminals 12 of the electronic part 10 can be readily separated from the contact member 18.

The present invention can be adapted to a test on the electronic part 10 such as an LSI chip, using the circuit board 14 as a testing circuit board and the contact member 18 as a testing terminal.

Moreover, the present invention can be adapted to such processing as writing of a program or image information in the electronic part 10 such as an LSI chip having an information storage facility or deletion or reading of information from the electronic part 10, using the circuit board 14 as an information processing circuit board having a function for storing or holding information in the electronic part and the terminal 18 as information writing or reading (storage or deletion) terminal.

Of course, a person having ordinary skill in the art can adapt the present invention to other uses.

Figure 3:
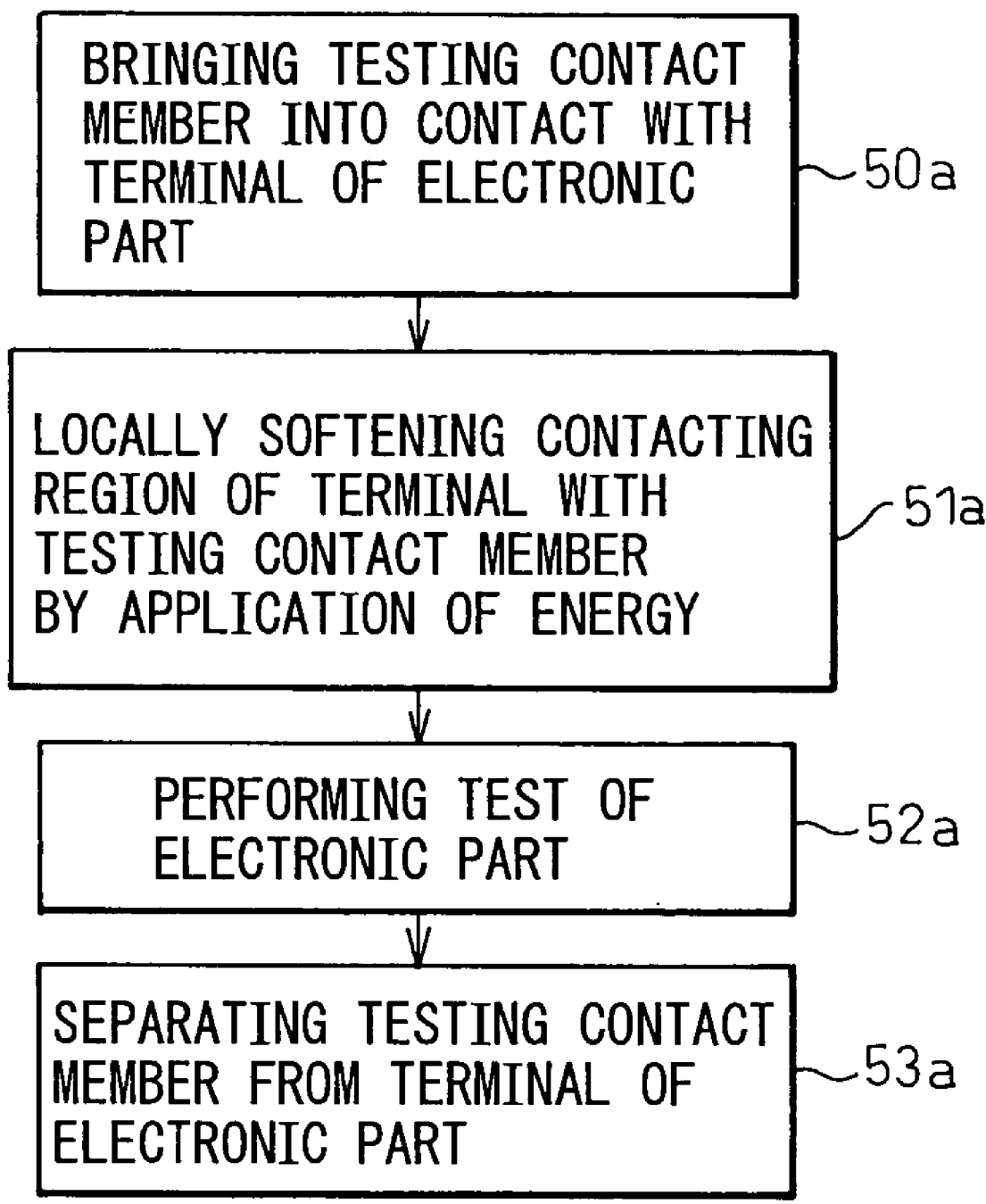
FIG. 3 is a flowchart explaining the principle of an electronic part testing method in accordance with the present invention.

FIG. 3 shows a fundamental procedure of an electronic part testing method according to the present invention.

In the present invention, first, the testing contact member 18 is brought into contact with the terminal 12 of the electronic part 10 (step 50a in FIG. 3).

Thereafter, energy is applied in order to locally soften a portion of the terminal 12 of the electronic part 10 contacting the testing contact member 18, so that the contacting area of the terminal and testing contact member is substantially enlarged (step 51a).

Thereafter, voltage and/or current is applied to the terminal 12 of the electronic part 10 and the testing terminal 18 in order to perform a predetermined test on the electronic part (step 52a).

After the test is completed, the contact member 18 and terminal 12 are separated from each other (step 53a).

Figure 4A:
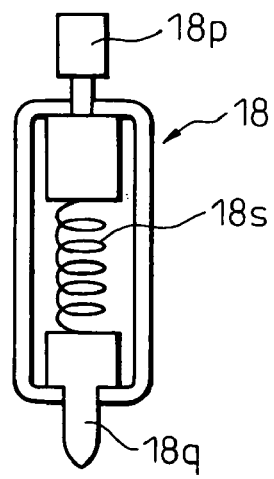
FIGS. 4A to 4C are views illustrating examples of contacts members.
Figure 4B:
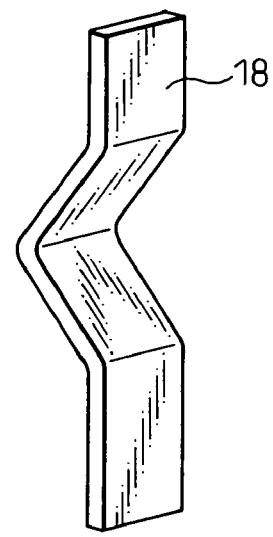
Figure 4C:
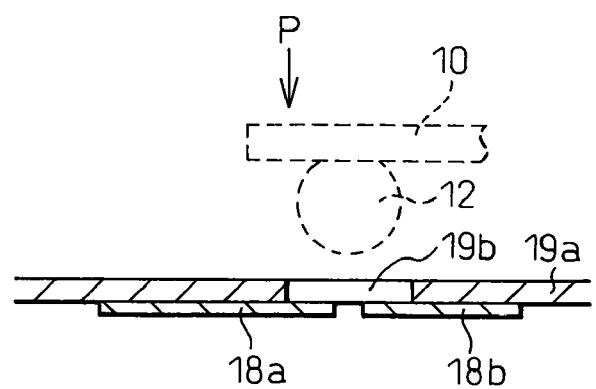

FIGS. 4A to 4C show examples of the contact member 18.

FIG. 4A shows an example of a contact called a spring probe having a spring 18s interposed between upper and lower contact portions 18p and 18q.

FIG. 4B shows an example of a contact member formed with a metallic plate that is bent and elastically deformable. Needless to say, the shape is not limited to the shape of a plate but may be the shape of a rod that is bent.

FIG. 4C shows an example of a contact member comprising an insulating substrate 19a having an opening 19b formed at a position corresponding to the terminal 12 of the electronic part 10, and two contact portions 18p and 18q fixed to one major surface of the insulating substrate 19a so that the contact portions are cantilevered and have the ends thereof opposed to each other within the opening 19b.

The terminal 12 of the electronic part 10 is inserted into the opening 19b from the other major surface side of the insulating substrate 19a and contacts the two contact portions 18p and 18q.

The contact portions 18p and 18q elastically contact the terminal 12 of the electronic part 10.

In the present invention, either one of these contact members 18 or a contact member in any other form can be adopted.

Now, the present invention will be described regarding more concrete embodiments.

First Embodiment

FIGS. 5 to 8 show an electronic part testing method to which the first embodiment of the present invention is adapted, the rough constitution of testing apparatus for carrying out the testing method, and a method of contacting the terminal of an electronic part to be tested with the testing terminal of the testing apparatus.

Figure 9:
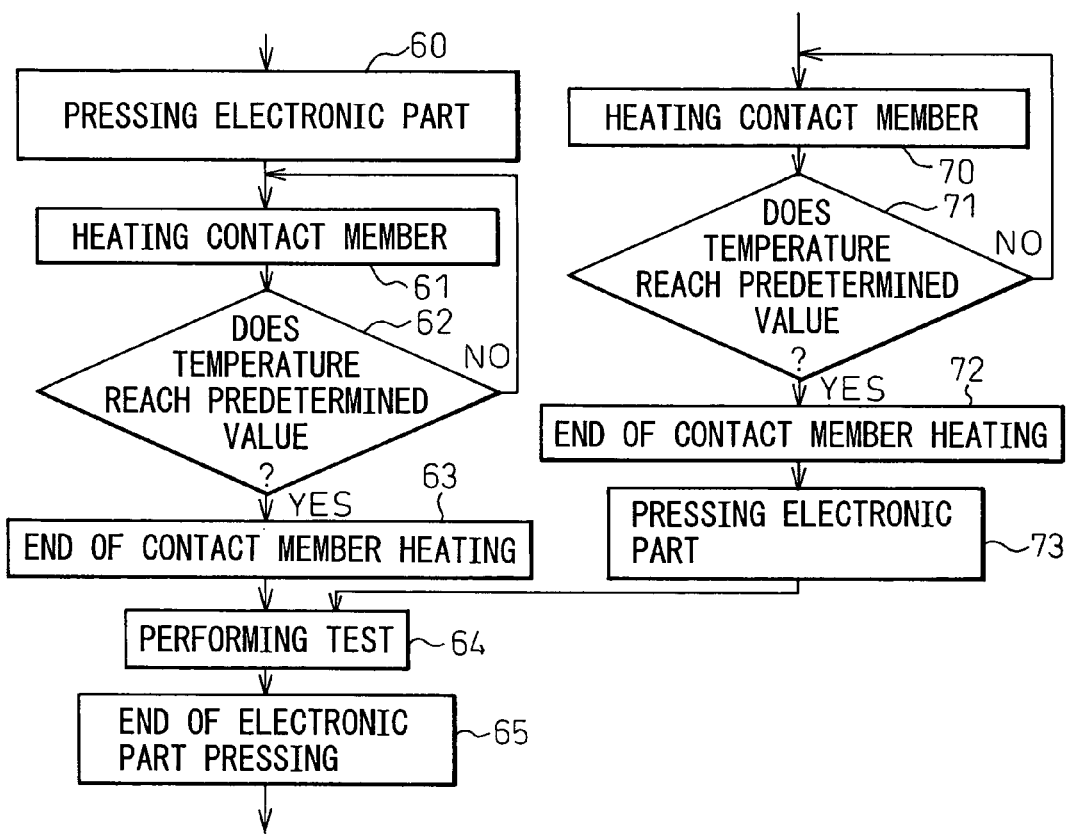
FIG. 9 is a flowchart illustrating the embodiments shown in FIGS. 5 to 8.

FIG. 9 is a flowchart illustrating the processing steps for carrying out the testing method and contacting method.

In FIG. 5, the electronic part 10 to be tested, such as an LSI chip has terminals 12.

On the other hand, the contact members 18 are held by a socket 20 and interposed between electrode pads (not shown) on the circuit board 14 and the terminal 12 of the electronic part 10.

A receptacle base 22 is elastically supported by the top of the socket 20 via a springs 21. The receptacle base 22 has openings 23 formed therein in register with the terminals 12 to receive the respective terminals 12 of the electronic part 10.

Moreover, a heater 24 is located in contact with or near the tips of the contact members 18 in the socket 20, and a temperature detection element 25 is located near the tips of the contact members 18.

Also, the circuit board 14 is connected to a testing signal generating circuit 26, and the heater 24 is connected to a heater control circuit 27. The temperature of the contact members 18 are detected by the temperature detection element 25, and fed back to the heater control circuit 27 for the purpose of control.

According to the present invention, the electronic part 10 to be tested is placed on the receptacle base 22 so that the terminals 12 are fitted in the openings 23 of the receptacle base 22, as shown in FIG. 6.

Thereafter, a pressure P is applied to the electronic part 10 to be tested against the spring 21, as shown in FIG. 7, so the terminal 12 of the electronic part and the contact member 18 contact each other (step 60 in FIG. 9).

According to the present invention, at this instant, energy is applied from the heater 24 to the contact member 18 and the temperature rise of the contact member 18 causes the terminal 12 contacting the contact member 18 to be locally softened (step 61).

The application of energy is achieved by heating the contact member 18 by the heater 24, and a portion of the terminal 12 of the electronic part 10 contacting the contact member 18 is heated through thermal conduction and softened, with the result that the area of the contacting portion of the terminal and contact member substantially increases.

Here, the heating using the heater 24 may be achieved in the state in which the terminal 12 of the electronic part 10 is contacting the contact member 18, or the contact member 18 alone is fully heated using the heater 24 in advance and the contact of the contact member 18 with the terminal 12 is achieved in the state in which the heater 24 is switched off.

In FIG. 9, step 60 to step 63 illustrate the case where, after the terminal 12 of the electronic part 10 contacts the contact member 18, the contact member 18 is heated.

The heating is controlled based on the temperature detected by the temperature detection element 25 (step 62), the heating is terminated after the temperature reaches a predetermined temperature (step 63).

On the other hand, step 70 to step 73 illustrates the case where the contact member 18 is heated in advance, and the contact member 18 contacts the terminal 12 of the electronic part 10 after the heater 24 is switched off.

The contact member 18 is heated using the heater 24 (step 70), the heating is controlled based on the temperature detected by the temperature detection element 25 (step 71), the heating is terminated after the temperature reaches a predetermined temperature (step 72).

Thereafter, the electronic part 10 is pressed against the circuit board 14, and the terminal 12 of the electronic part 10 is brought into contact with the contact member 18 to locally soften the contacting portion (step 73).

In this way, in the case where the contact member 18 alone is heated, and the contact member 18 and the terminal 12 of the electronic part 10 contact each other after the heater 24 is switched off, the contacting portion of the terminal 12 and contact member 18 is warmed by the heat capacity of the contact member 18, so the temperature of the contact member 18 and terminal 12 must be regulated in advance depending on the structures and the materials of the contact member 18 and the terminal 12.

In the case where the heater 24 is used for heating, if the terminal 12 of the electronic part 10 is made of a lead (Pb)-free solder, the contact member 18 is heated to about 200° C. that is lower than the melting point of a high-melting point solder, and the electronic part 10 is pressed under a pressure of 0.01 N per one terminal after the power supply of the heating heater 24 is turned off, so that a low resistance contact is established between the contact member 18 and the terminal of the electronic part 10.

According to the foregoing contacting method, the contact member 18 can be made of tungsten (W) plated with nickel or copper alloy plated with rhodium, and in this case, an average contact resistance of about 0.05 Ω can be realized. A plating of alloy of palladium and cobalt may be substantiated for rhodium.

Thereafter, a predetermined electric test is performed on the electronic part under such a low resistance contact state.

In the electric test, the test can be achieved under the stable, low resistance contact state.

After the predetermined electric test is completed, the pressing the electronic part 10 against the contact member 18 is terminated (step 65).

Figure 8:
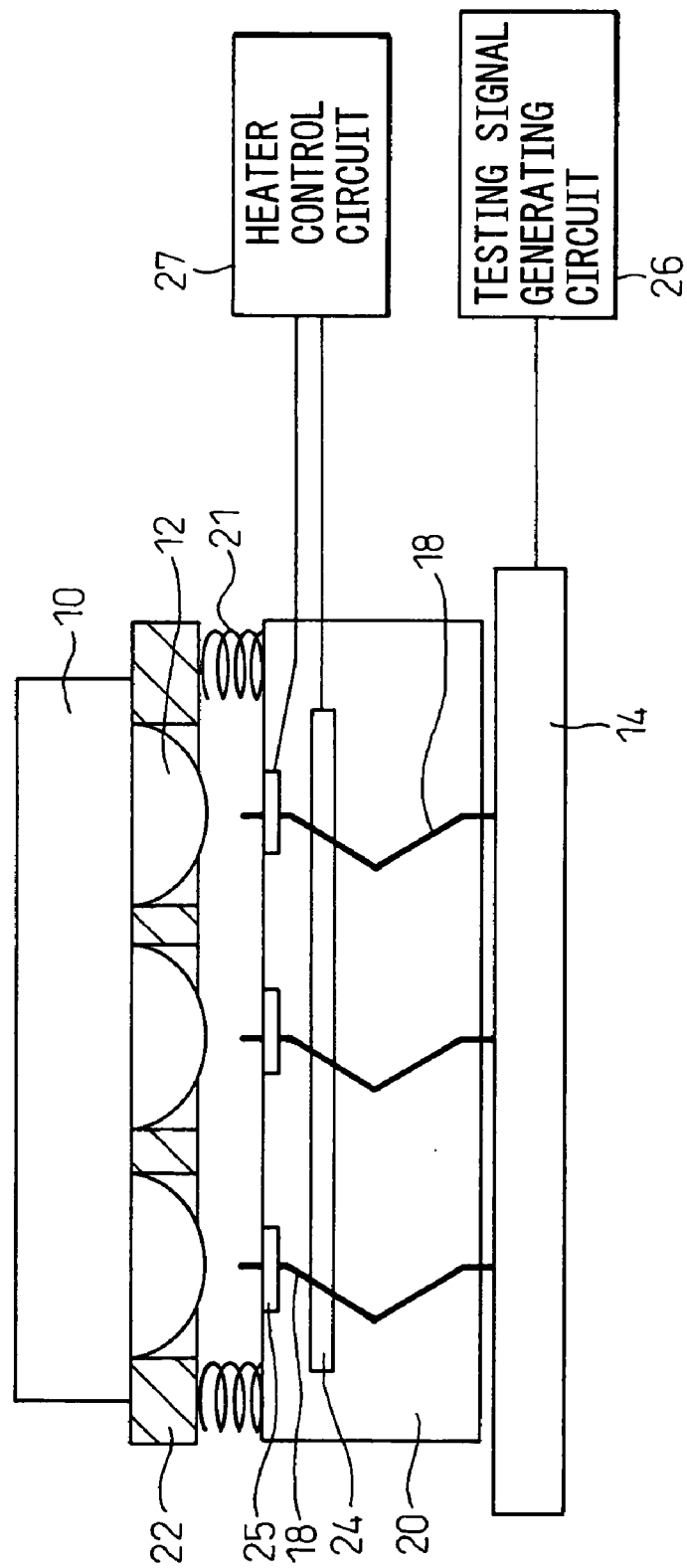
FIG. 8 is a view illustrating the constitution and the operation of an embodiment.

Consequently, the electronic part 10 is pushed upward by the springs 21 of the receptacle base 22, as shown in FIG. 8, and the contact member 18 and the terminal 12 of the electronic part 10 is readily separated from each other and the contact is released.

Second Embodiment

Figure 10:
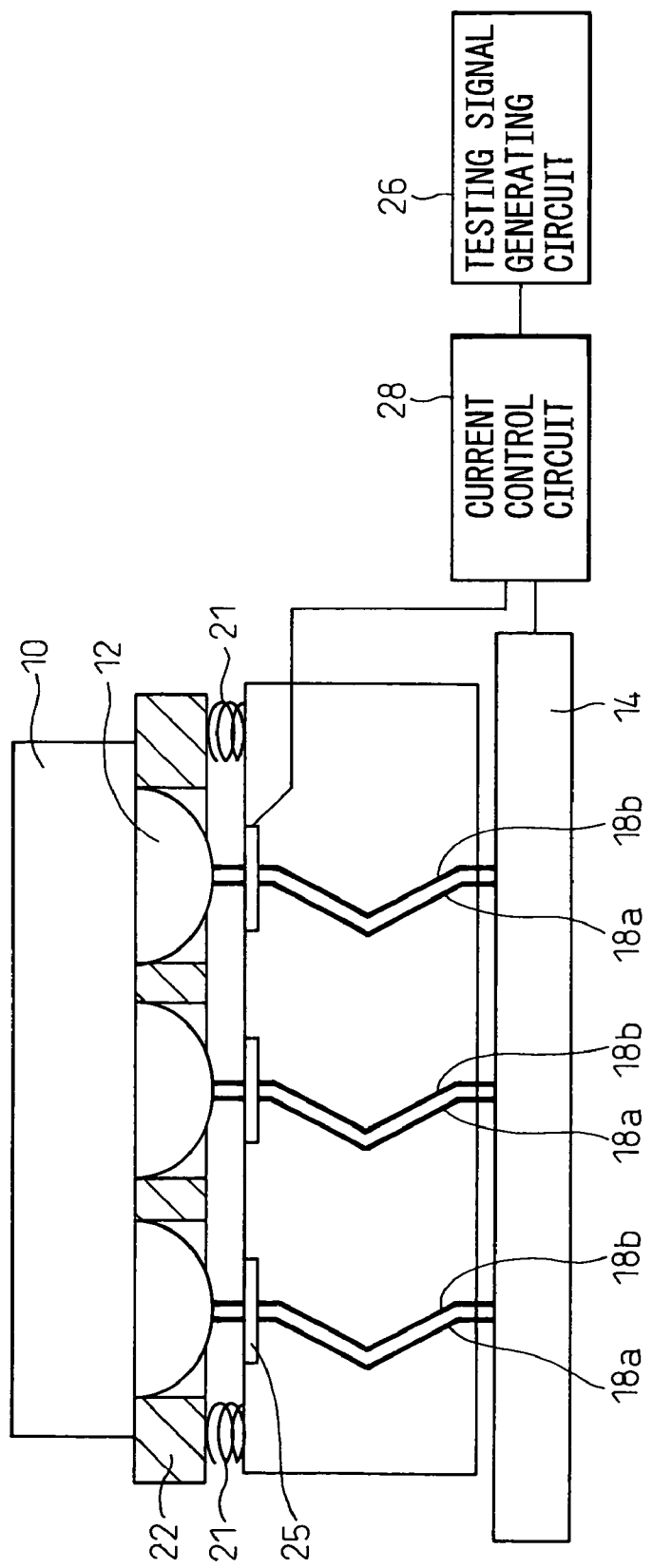
FIG. 10 is a view illustrating another embodiment of the present invention.

FIG. 10 shows a method of contacting a testing contact member with a terminal of an electronic part, for carrying out an electronic part testing method according to the second embodiment of the present invention.

Figure 11:
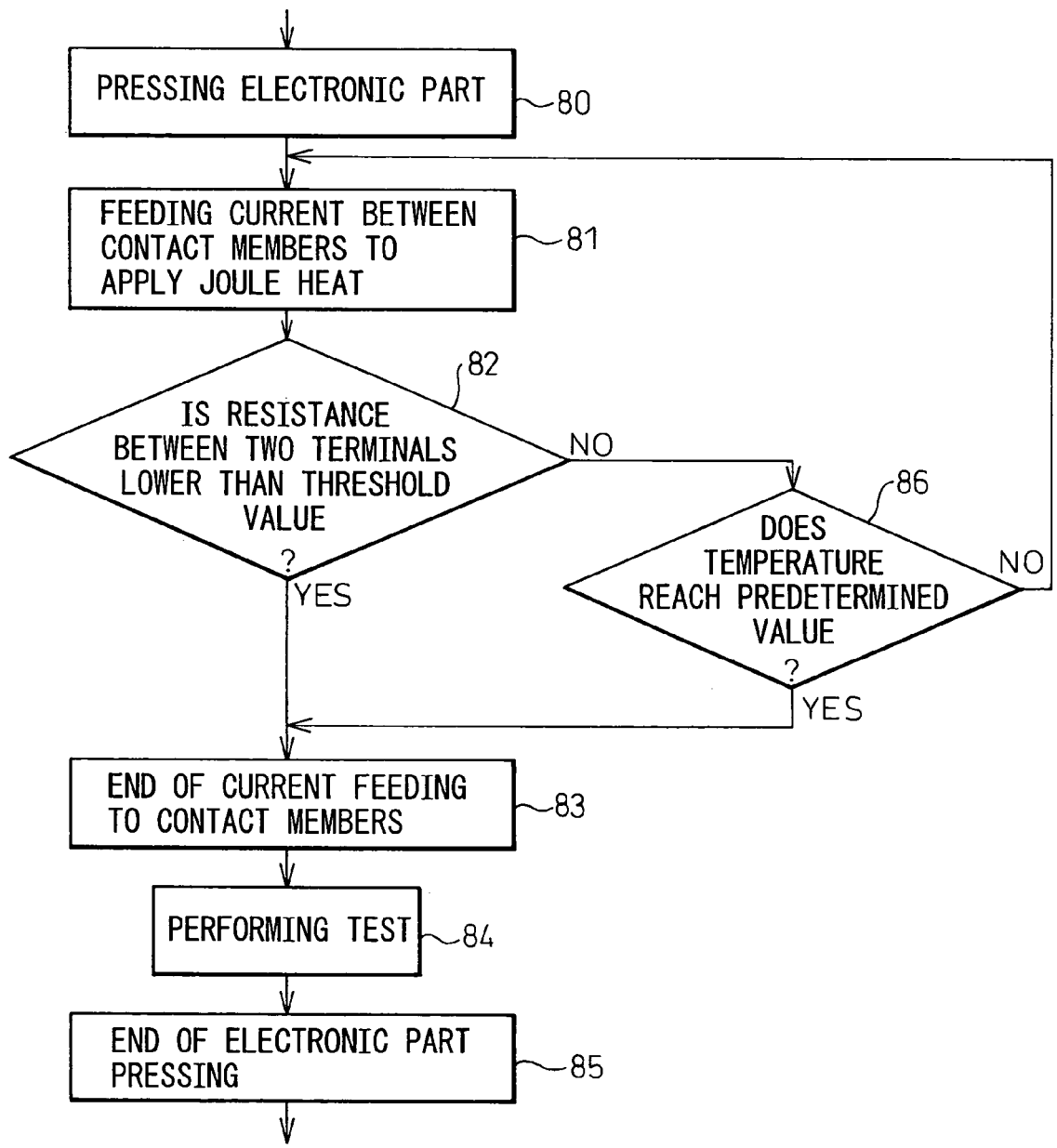
FIG. 11 is a flowchart illustrating the embodiment of FIG. 10.

FIG. 11 is a flowchart illustrating the process steps for carrying out the testing method and the contacting method.

The arrangement of the testing apparatus shown in FIG. 10 has the similar configuration to the one employed in the first embodiment, except that this embodiment is different from the first embodiment in that means for applying energy to the contacting portion of the terminal of the electronic part and contact member.

In FIG. 10, the same reference numerals are assigned to components corresponding to those described in relation to the first embodiment.

In the second embodiment too, the contact member 18 connected to the electric circuit 14 is brought into contact with the terminal 12 of the electronic part 10. Namely, a pressure P resistive to the springs 21 is applied to the electronic part 10 to be tested, whereby the terminals 12 of the electronic part and the contact members 18 contact each other.

In the present embodiment, two contact members 18a and 18b are arranged to separately contact the surface of the terminal 12 of the electronic part, and current is fed to flow through the contact member 18a, the terminal 12, and contact member 18b, whereby the contact 18 is heated with Joule heat. The heating current is fed from a current control circuit 28.

Specifically, first, the electronic part 10 is pressed against the electric circuit 14 in order to bring the terminal 12 of the electronic part 10 into contact with the contact members 18a and 18b (step 80 in FIG. 11).

The current control circuit 28 feeds current to the contact members 18a and 18b, to cause a portion of the terminal 12 contacting the contact members 18a and 18b to be softened with Joule heat (step 81).

Whether or not the resistance between the contact members 18a and 18b becomes equal to or lower than a threshold is detected (step 82). If the resistance become equal to or lower than the threshold, or if temperature detected by the temperature detection element 25 reaches a predetermined value (step 86), current feed is terminated (step 83).

Namely, according to the present embodiment, the portion of the terminal 12 contacting the contact members 18 is softened with Joule heat in order to enlarge the area of the portion of the terminal contacting the contact member 18. Thus, a constriction resistance at an interface between the contact member and the terminal is lowered.

At this time, a film such as an oxide covering the surface of the terminal 12 is softened, so that the contact member 18 can easily penetrate the film and the inter-metallic connection between the metal portion of the terminal 10 and the contact member 18 is improved, whereby the contact resistance between them is lowered.

Thereafter, a predetermined electric test is performed under this low resistance contacting state (step 84).

At this time, the connection of the contact members 18a and 18b is changed from the current control circuit 28 to a testing signal generating circuit 26 by a signal changing switch SW. Namely, for testing, the contact members 18a and 18b are connected to the terminal 12 in parallel with each other, and consequently, the contact resistance between is further lowered.

After the test is completed, pressing the electronic part 10 is terminated, and the terminal 12 of the electronic part 10 is separated from the contact member 18 and the connection is released from each other (step 85).

Figure 12:
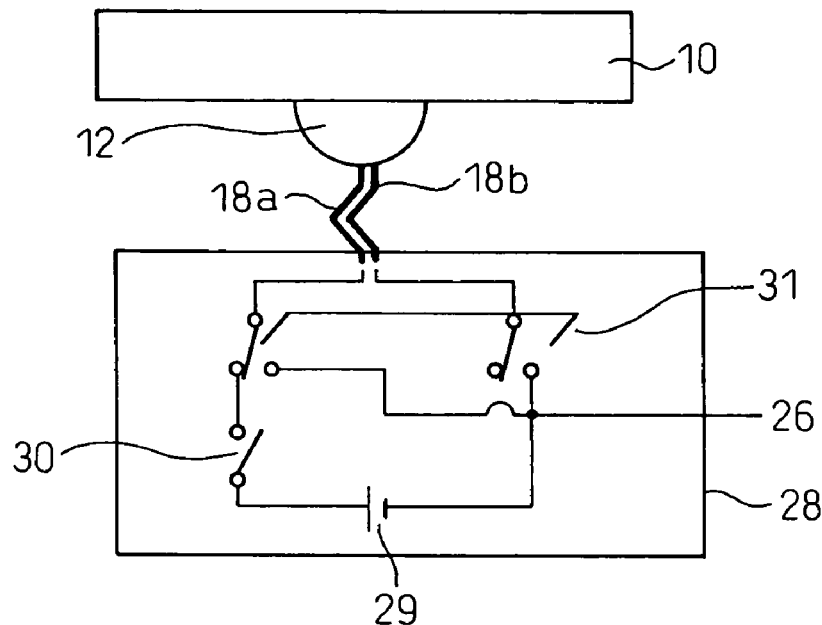
FIG. 12 is a circuit diagram including the current control circuit and the testing signal generation circuit shown in FIG. 10.

FIG. 12 shows the configuration of the current control circuit 28.

Figure 13:
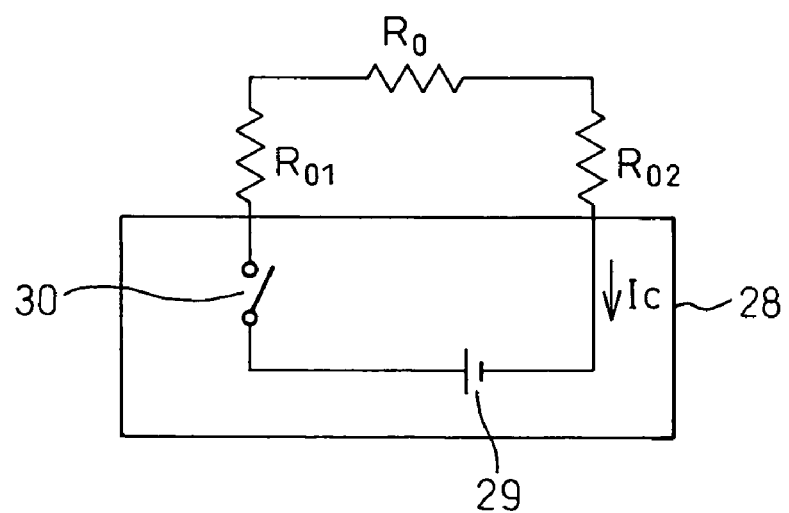
FIG. 13 is a view illustrating an equivalent circuit of the electric circuit shown in FIG. 12.

Moreover, FIG. 13 shows an equivalent circuit when the contact members 18a and 18b contact the terminal 10 of the electronic part.

The current control circuit 28 includes a dc power supply 29, a switch 30, and a signal changing switch 31.

Vc denotes a voltage of the dc power supply 29, Rc1 denotes a contact resistance between the contact member 18a and the terminal 12, Rc2 denotes a contact resistance between the contact member 18b and the terminal 12, and Ro denotes a resistance in the terminal 12.

The resistance Ro in the terminal 12 made mainly of a solder and between the contact members 18a and 18b is approximately 0.01 Ω, and the contact resistance Rc1 between the first contact member 18a and the terminal 12 and the contact resistance Rc2 between the second contact member 18b and the terminal 12 range from 0.05 Ω to 0.5 Ω, respectively.

When the contact resistances Rc1 and Rc2 are 0.5 Ω, a current of approximately 4.9 A flows, and power consumed due to the contact resistances comes to 11.8 W.

After the switch 30 is made on and when about 0.02 sec elapses, the resistances decrease to 0.05 Ω. The switch 30 is then broken.

In terms of power consumed at this time, the rise in the temperature of the terminal 12 and the contact member 18 is very small, and the influence of the surroundings is large. Assuming that a loss caused by dissipation of heat to the surroundings and else is 95%, the consumed energy is 0.24 J and the energy used as heat by the terminal 12 is 0.012 J. The volume of the terminal 12 is approximately 0.01 mm$^3$ (for a diameter of 0.3 mm) and the volume of the contact member 18 is 0.01 mm$^3$×2.

In the case where the material of the terminal 12 is solder (Pb—Sn), the specific heat of the terminal is approximately 0.42 cal/g° C., and in the case where the material of the contact member 18 is carbon tool steel (SK), the specific heat of the contact member is approximately 0.12 cal/g° C., and consequently, the temperature rises 180° C.

Due to the rise in the temperature of the terminal 12, the oxide film is broken and the contact resistance is lowered, whereby a stable contacting effect is attained.

Also, similarly to the first embodiment, when the contact member 18 is plated with a platinum group metal, a ruthenium and cobalt alloy, or rhodium, the material of the terminal 12 does not adhere to the plating. Even when the contact member is repeatedly contacted to the terminal, reliable connection to a circuit is attained on a stable basis.

Incidentally, a current required for heating is larger than a current required for testing. The current required for heating ranges from 1 A to 5 A, while the current required for testing ranges from several μA to about 50 mA.

In the present invention, after establishing a low resistance contact between the terminal of the electronic part and two contact members, by adopting the method shown in FIGS. 10 and 11, and in the test of the electronic part, one of the two contact members may be used to transmit a testing signal and the other contact member may be used to monitor a contact state.

Figure 14:
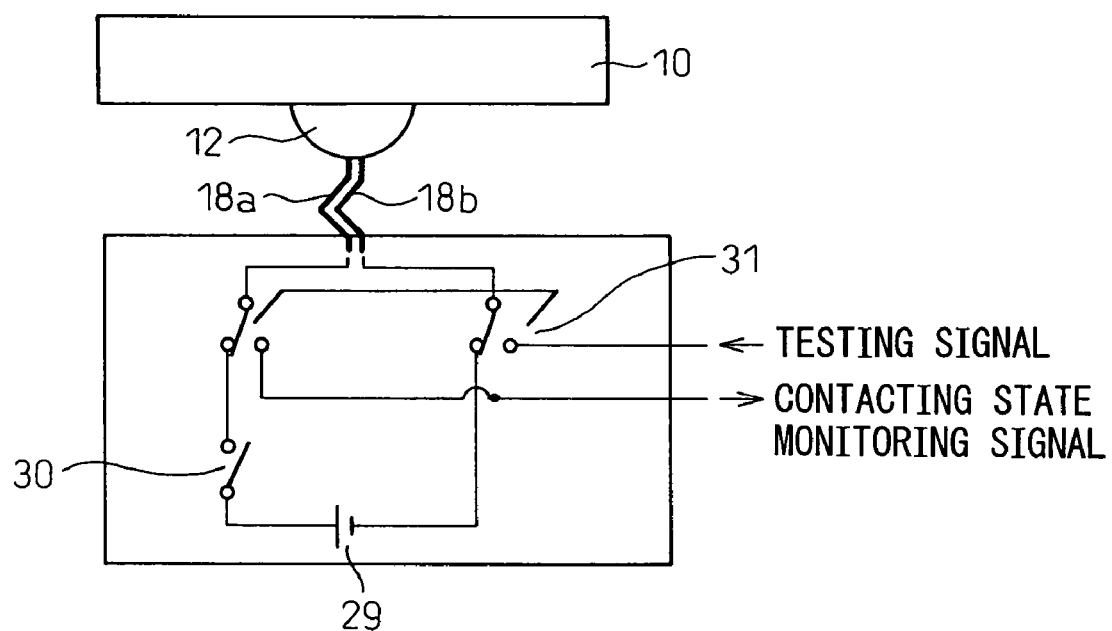
FIG. 14 is a view illustrating an electric circuit according to anther embodiment of the present invention.

Specifically, in the connecting configuration shown in FIG. 14, by using one contact member 18a for monitoring the contacting state, whether or not a cause of a defect is an incorrect contact between the contact member and the terminal can be determined. In such a case, by performing the test again, it is possible to prevent that a normal electronic part is judged to be a defective one.

Third Embodiment

Figure 15:
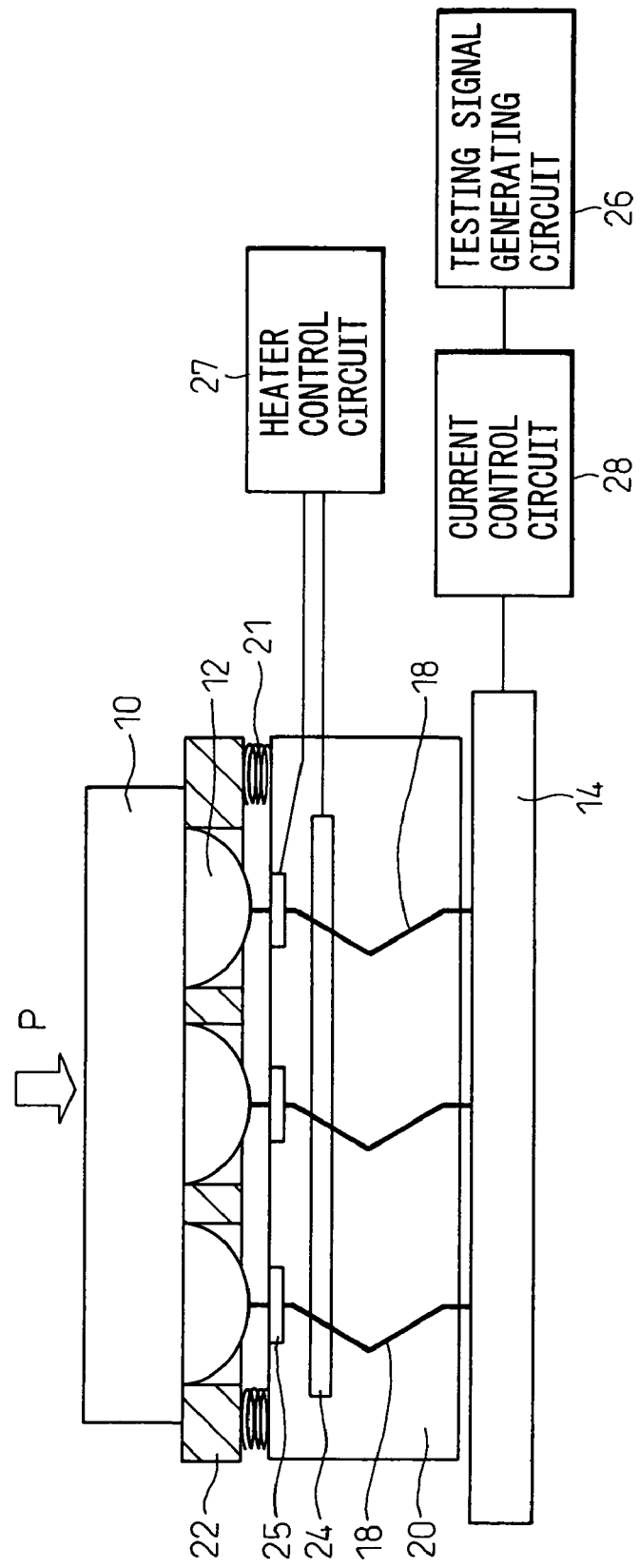
FIG. 15 is a view illustrating a further embodiment of the present invention.

FIG. 15 shows an electronic part testing method according to the third embodiment of the present invention, and a method of contacting a terminal of an electronic part with a contact member for carrying out the testing method.

Figure 16:
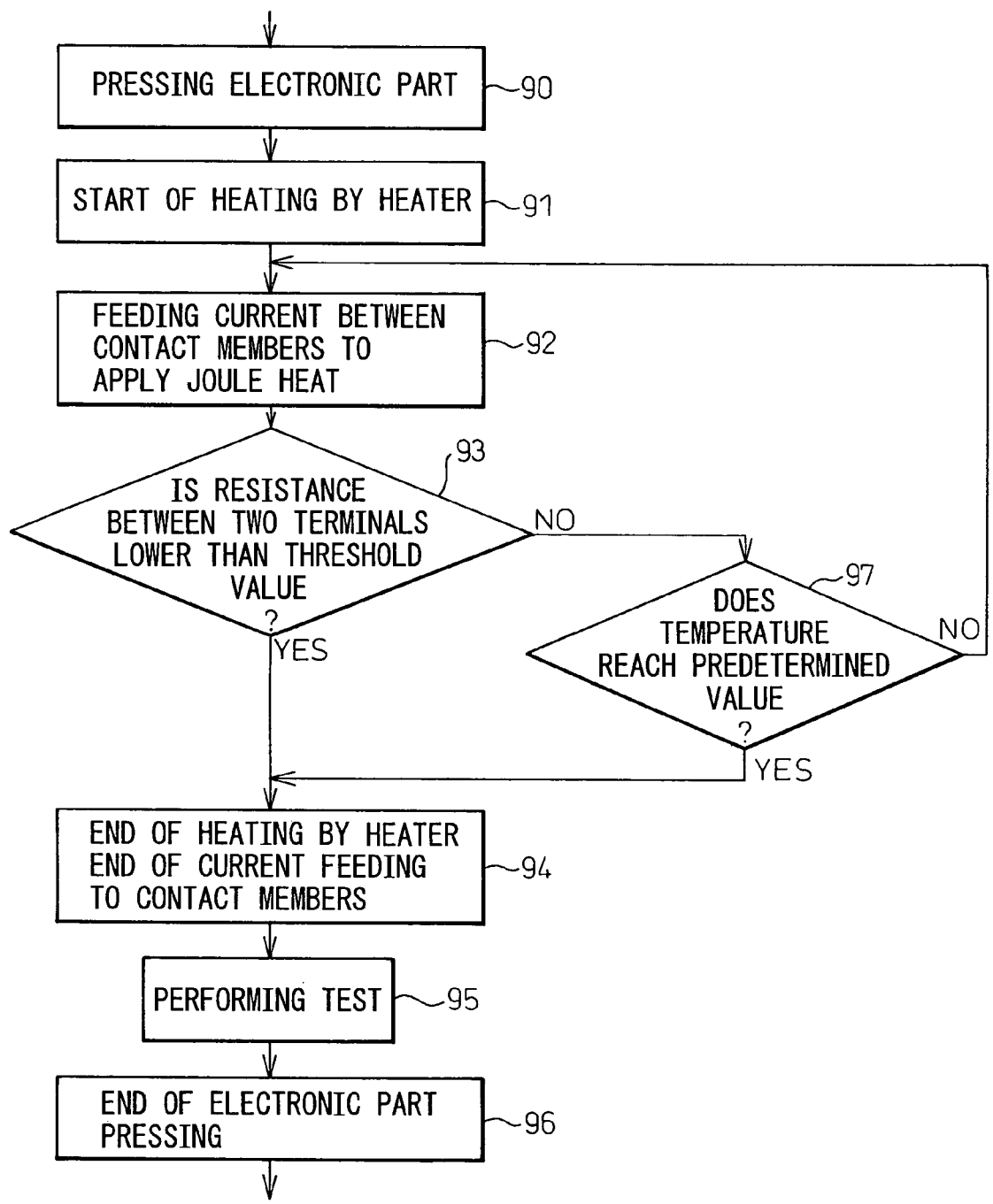
FIG. 16 is a flowchart illustrating the embodiment shown in FIG. 15.

FIG. 16 is a flowchart illustrating the process steps for carrying out the testing method and the contacting method.

In the present embodiment, both heating using a heater employed in the first embodiment and heating with Joule heat employed in the second embodiment are adopted.

Consequently, the testing apparatus shown in FIG. 15 has the same configuration as those employed in the first and second embodiments.

In the present embodiment, after the electronic part 10 to be tested is placed in position and pressed (step 90 in FIG. 16), the terminal 12 is heated, by heating the contact member 18 using the heater 23 (step 91), and by Joule heat generated by flowing the current through the contact member 18a, the terminal 12 and the contact 18b (step 92). As the two heating methods are adopted, the heating time can be shortened.

After the test is completed (step 95), pressing is terminated (step 96).

In the aforesaid first to third embodiments, the present invention is explained by way of an example of the electronic part testing, but the method of contacting the contact member with the terminal of the electronic part can be adapted to the writing of information in an electronic part such as a semiconductor memory or the deletion or the reading of information from the electronic part, which will be described in conjunction with subsequent embodiments.

Fourth Embodiment

Figure 17:
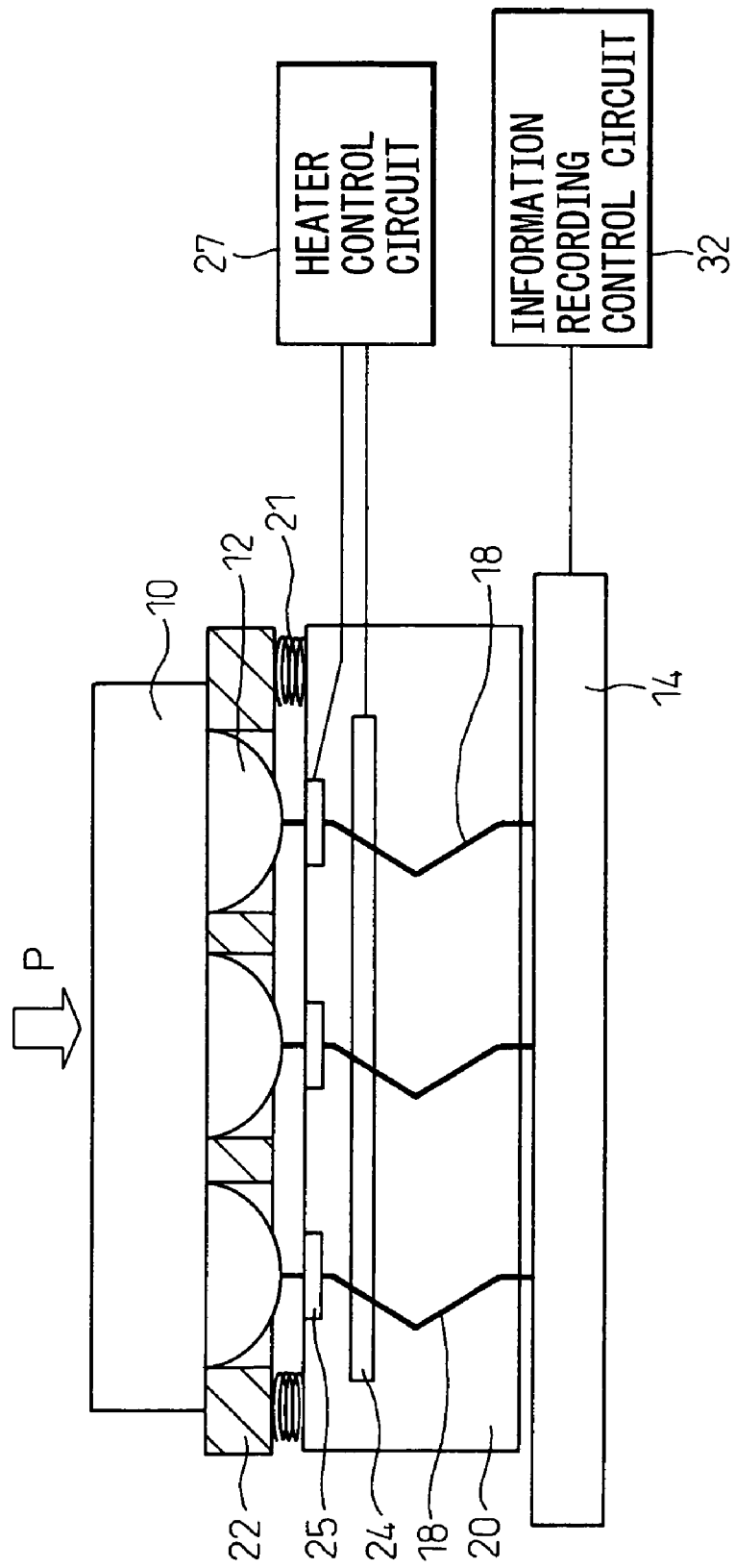
FIG. 17 is a view illustrating a further embodiment of the present invention.

FIG. 17 shows a method of information processing, such as, writing, reading, or deletion of information in or from an electronic part such as a processor element including a semiconductor memory or an information memory, according to the fourth embodiment of the present invention, and a method of contacting a terminal of an electronic part with a contact member, for carrying out the information processing method.

Upon carrying out the processing method according to the present embodiment, means for improving the connectability of contact member and the terminal of the electronic part is the same as the one employed in the first to third embodiments.

That is, in the present embodiment, the electronic part 10 to be treated, such as a memory chip, has terminals 12, as shown in FIG. 17.

On the other hand, contact members 18 are interposed between electrode pads (not shown) of a circuit board 14 and the terminals 12 of the electronic part 10 while being held in the socket 20.

A receptacle base 22 is elastically supported on the top of the socket 20 via a springs 21. The receptacle base 22 has openings 23, which are formed corresponding to the terminals 12 of the electronic part 10 to accommodate the respective terminals 12.

A heater 24 is located in contact with or near the tips of the contact member 18 within the socket 20, and a temperature detection element 25 is located at a position near the tips of the contact members 18.

On the other hand, the circuit board 14 is connected to an information recording control circuit 32, and the heater 24 is connected to a heater control circuit 27.

In the present invention, as shown in FIG. 17, the electronic part 10 has the terminals 12 fitted into the openings 23 of the receptacle base 22, and is thus placed on the receptacle base 22.

A pressure P is applied to the electronic part 10 to be treated against the springs 21, whereby the terminals 12 of the electronic part are bought into contact with the contact members 18.

In the present invention, energy is selectively applied from the heater 24 to the contacting portion of the contact member 18 and terminal 12, and the portion of the terminal 12 contacting the contact member 18 is locally softened (step 61).

The application of energy is achieved by heating the contact member 18 by the heater 24. Consequently, the portion of the terminal 12 of the electronic part 10 contacting the contact member 18 is locally softened, and the area of the contacting portion of the terminal and contact member is substantially enlarged.

Here, the heating using the heater 24 may be performed with the terminal 12 of the electronic part 10 in contact with the contact member 18, or alternatively, the heater 23 may be used to sufficiently heat the contact member 18 alone in advance, and the contact member 18 may be brought into contact with the terminal 10 after the heater 23 is switched off.

Owing to the foregoing method, the contact resistance between the terminal of the electronic part and the contact member is substantially lowered and, in this state, the information recording control circuit 32 is driven in order to write, read, or delete information in or from the semiconductor memory included in the electronic part. At this time, as the contact resistance between the contact member and the terminal of the electronic part is low enough to achieve writing, reading, or deletion at a high speed with high reliability.

So far, the embodiments have been described by way of examples in which a contact member referred to as a spring probe is adopted as the contact member 18, but the present invention is not limited to the spring probe and a contact member in which the aforesaid contact portions 18a and 18b are coaxially integrated (hereinafter a coaxial contact member) may be adopted.

Figure 18:
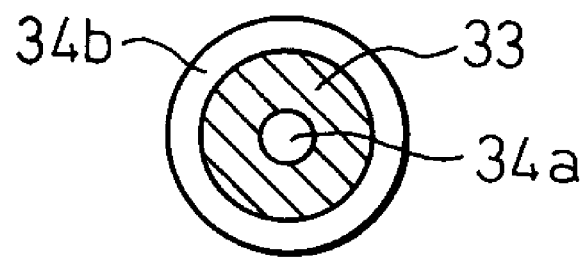
FIG. 18 is a cross-sectional view showing an example of a contact member suitable for an embodiment in which two contact members are used per one terminal.
Figure 19:
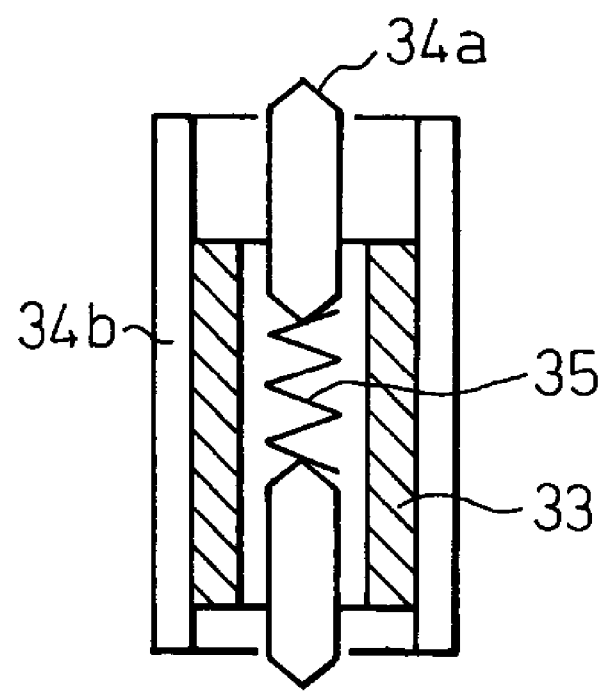
FIG. 19 is a longitudinal sectional view of the contact element shown in FIG. 18.

The structure of the coaxial contact member will be shown in a cross sectional view, perpendicular to the axial direction (FIG. 18), and in an axial sectional view (FIG. 19).

Specifically, two contact portions 34a and 34b are coaxially disposed via an insulating cylinder 33. The internal (central) contact portion 34a is axially divided into two sections within the insulating cylinder 33, and can be elastically moved axially owing to a spring 35. The other contact portion 34b is mounted on the periphery of the insulating cylinder 33 in the cylindrical form.

Figure 20:
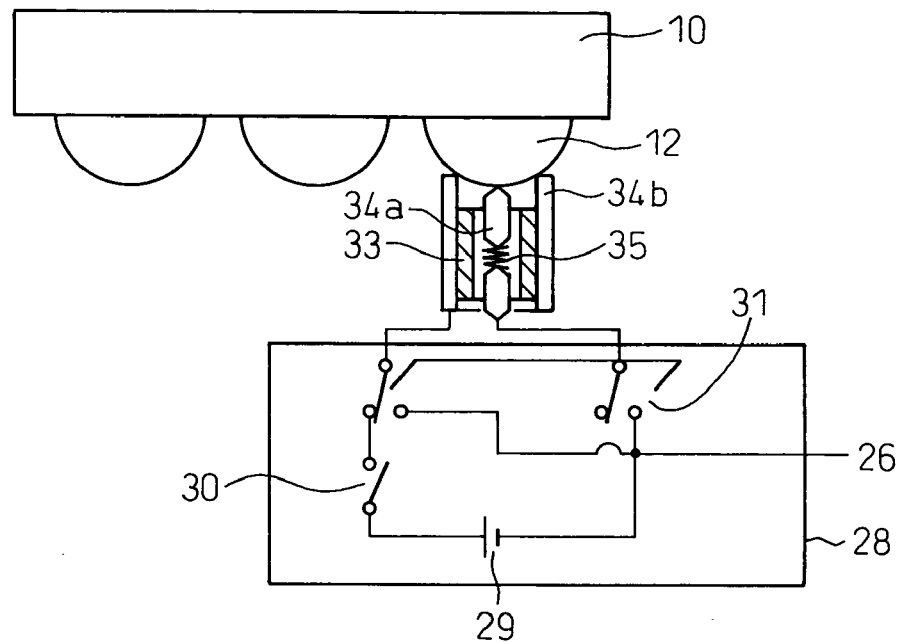
FIG. 20 is a circuit diagram, similar to FIG. 12, but including the contact member shown in FIGS. 18 and 19.

In the coaxial contact member constructed in this manner, the contact portion 34a is elastically and axially movable, and the contact portion 34b is cylindrical, so that even when the terminal 12 has a hemispherical or spherical convex shape, like a solder bump, the contact portion 34a elastically contacts the terminal while receding axially in line with the convex shape, as shown in FIG. 20. Moreover, the contact portion 34b contacts the terminal over substantially the whole of the cylindrical end surface.

Consequently, more reliable contact can be achieved relative to the terminal.

In FIG. 20, the illustration of the socket is omitted.

In the present invention, the pair of contact members 18a and 18b may be mutually closely disposed on a common plane so that the ends of the contact members will be opposed to each other.

Specifically, the pair of contact members 18a and 18b are disposed mutually closely within the openings that are formed in a support body such as a wiring board in association with the terminals of an electronic part.

Figure 21:
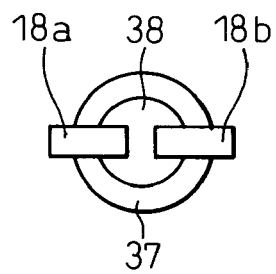
FIG. 21 is a cross-sectional view showing an example of a contact member suitable for an embodiment in which two contact members are used per one terminal.
Figure 22:
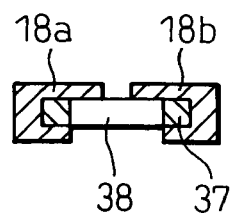
FIG. 22 is a longitudinal sectional view of the contact member shown in FIG. 21.
Figure 23:
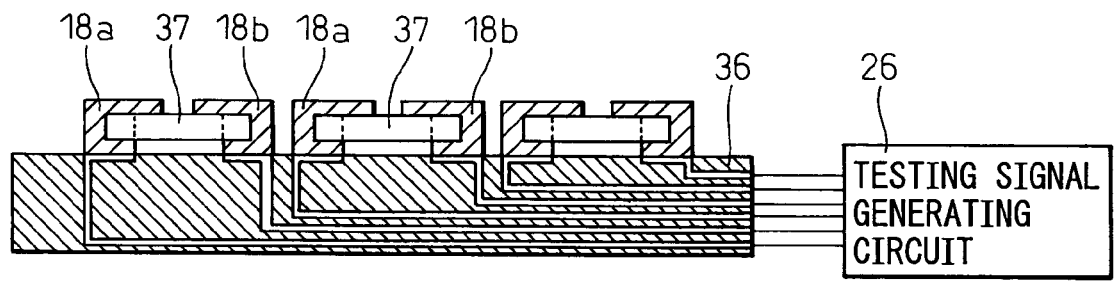
FIG. 23 is a view illustrating a unit in which a plurality of contact members shown in FIGS. 21 and 22 are collectively arranged.

As shown in FIGS. 21 to 23, the pair of contact members 18a and 18b are mounted on each of a plurality of annular insulators 37, which is formed on a wiring board 36 in association with the terminal of an electronic part to be treated, so that the ends of the contact members will be opposed to each other within the opening of the annular insulator 37. At this time, the contact members 18a and 18b are cantilevered to the annular insulator 37, and connected to a control or processing unit, such as testing equipment, via the wiring board.

The terminals of the electronic part are put in the openings of the annular insulators 37. Thus, each of the terminals contacts the contact members 18a and 18b.

In the foregoing structure of the contact member, if the terminal 12 has, like a solder bump, a semispherical or spherical convex shape, the contact members 18a and 18b are warped into a space defined by the annular insulator 37, that is, the opening 38 in line with the convex shape, and elastically contacts the terminal 12.

In the aforesaid embodiments of the present invention, heating using a heater and heating with Joule heat evolved during electrical conduction are adopted as a method of applying energy to the contact member. Aside from these techniques, heating of the contact member using a so-called pulse heater may be adopted.

Figure 24:
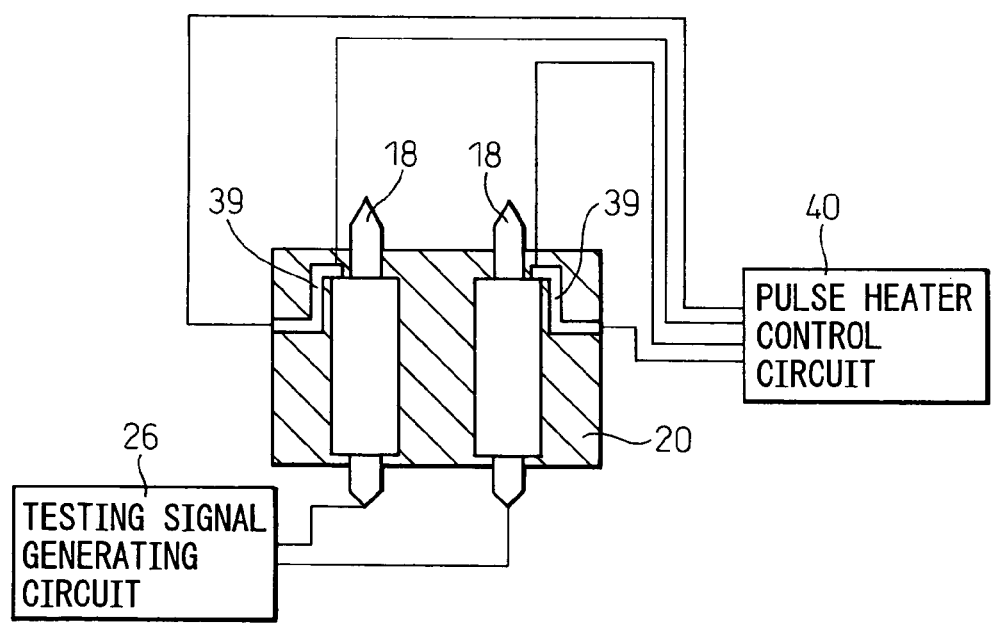
FIG. 24 is a view illustrating an example in which a pulse heater is used as an example of a heater employed in the embodiments shown in FIGS. 5 and 17.

FIG. 24 shows a configuration having a pulse heater 39 located near a spring probe type contact member 18 embedded in a socket 20 made of an insulating material. The pulse heater 39 is connected to and controlled by a pulse heater control circuit 40.

Moreover, the contact member 18 is connected to a desired processing or control unit such as a testing signal generation circuit 26.

In the above configuration, the pulse heater control circuit 40 causes current to flow into the pulse heater 39, and the tip of the contact member 18 is heated with Joule heat evolved proportionally to the internal resistance of the pulse heaters 39.

When the surface of the terminal 12 (not shown) contacting the heated contact member 18 is softened and the contact resistance between the contact member 18 and the terminal 12 is lowered, heating using the pulse heaters 39 is terminated.

After heating is terminated, the contact member 18 is electrically connected to the testing signal generation circuit 26 or any other processing or control unit. A test or any other desired processing is then performed on the electronic part.

After the processing is completed, the contact member 18 and terminal 12 are separated from each other.

Figure 25:
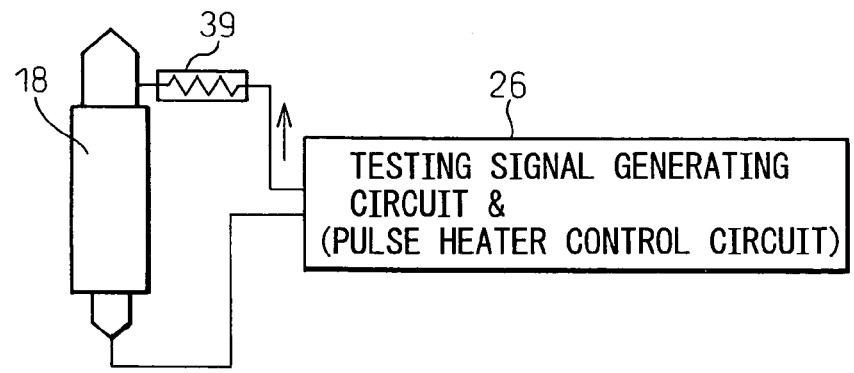
FIG. 25 is a view illustrating an example in which a pulse heater control circuit is not included separately but the function of the pulse heater control unit is incorporated in the testing signal generation unit.

FIG. 25 shows an example in which a pulse heater control circuit is not independently provided but the function of the pulse heater control circuit is incorporated in the testing signal generating unit 26.

Furthermore, in the present invention, producing heat by applying energy through electromagnetic induction may be adopted as a method of applying energy to the contact member.

Figure 26:
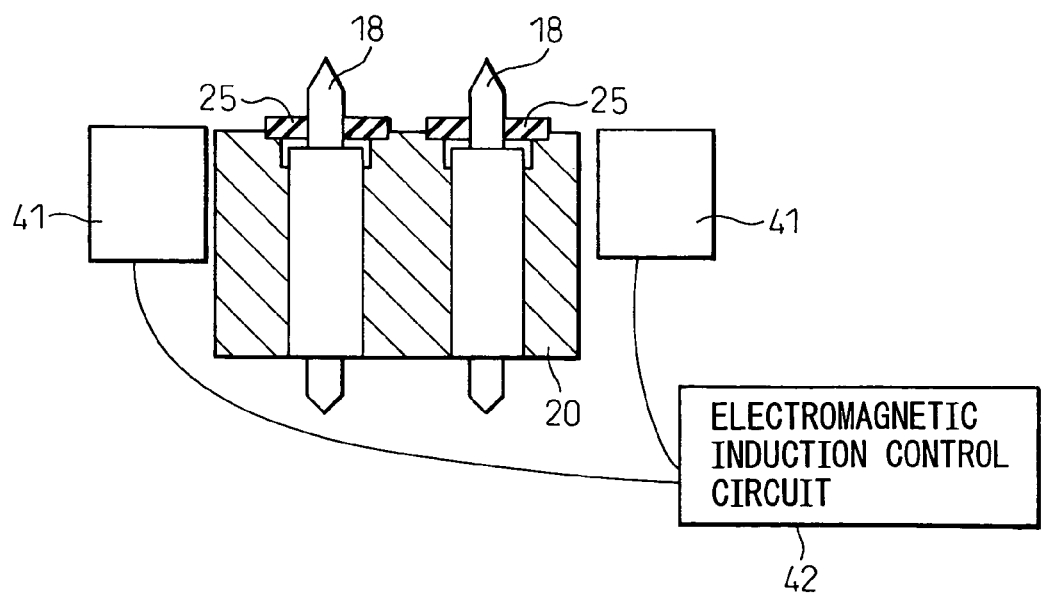
FIG. 26 is a view illustrating an example in which an electromagnetic induction coil is used for heating.
Figure 27:
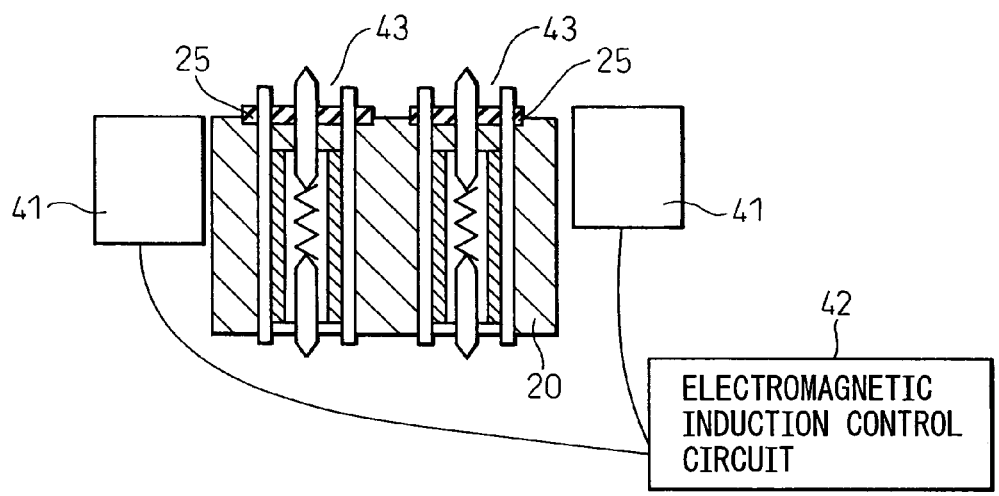
FIG. 27 is a view illustrating an example in which heating through electromagnetic induction is adapted to an embodiment in which two contact members are used per one terminal.
Figure 28:
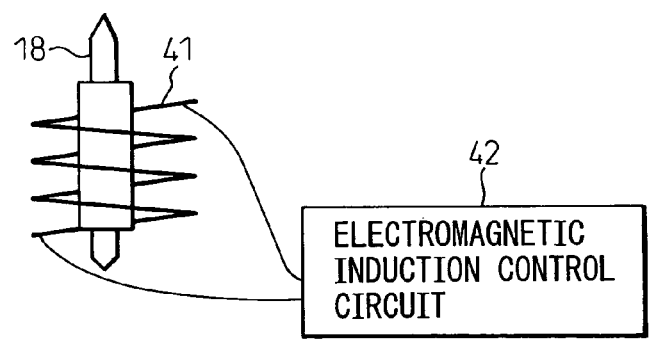
FIG. 28 is a view illustrating the electromagnetic induction control unit of FIG. 27 in a simplified manner.

Specifically, as a means for applying energy to the contact member through electromagnetic induction, any of configurations shown in FIGS. 26 to 28 or a combination thereof can be adopted.

In the configuration shown in FIG. 26, an electromagnetic induction coil 41 is disposed around a socket 20 in which a plurality of contact members 18 referred to as spring probes is embedded. The electromagnetic induction coil 41 is connected to an electromagnetic induction control unit (circuit) 42.

High-frequency (50 kHz or more) current is applied to the electromagnetic induction coil 41, whereby alternating current flows into the contact members 18 in the socket 20 because of electromagnetic induction. Consequently, the contact members 18 are heated.

Also, a temperature detection element 25 is disposed near the tip of the contact member 18 in order to detect the temperature of the heated contact member.

In the configuration shown in FIG. 27, an electromagnetic induction coil 41 is disposed around the socket 20 in which a plurality of coaxial contact members 43 are embedded. The electromagnetic induction coil 41 is connected to an electromagnetic induction control unit (circuit) 42.

When high-frequency (50 kHz or more) current is applied to the electromagnetic induction coil 41, alternating current flows into the coaxial contact members 43 in the socket 20 because of electromagnetic induction. The coaxial contact members 43 are heated with Joule heat. A temperature detection element 25 is disposed near the tip of the contact member 18 in order to detect the temperature of the heated contact member.

The electromagnetic induction coil 41 may be, as shown in FIG. 28, formed around the respective contact member 18 in the socket 20 (not shown).

The aforesaid embodiments of the present invention are concerned with a test or information processing to be performed on the electronic device such as a semiconductor chip provided in the form of a CSP or the like, but the present invention is not limited to those applications, and can be adapted to a case where a test or any other processing is performed on each of a plurality of electronic parts formed on a semiconductor substrate (wafer).

Specifically, when a test is performed on a plurality of electronic parts formed on one semiconductor substrate or a so-called wafer, probes (contact members) are brought into contact with the electrode terminals of the electronic parts, and laser light is irradiated onto the vicinities of the portions of the probes contacting the electrode terminals of the electronic part, whereby the probes are heated, so that the conducting heat softens the surfaces of the electrode terminals contacting the probes, so that, the area of the contacting portion of the probe with the electrode terminal of the electronic part is substantially enlarged.

At this time, a temperature detection element is disposed near the probe in order to monitor the temperature of the probe for fear the rise in the temperatures of the probe and the electrode terminal may affect the shape thereof. If the temperature of the probe rises to become equal to or higher than a predetermined temperature, irradiation of laser light is suspended.

Figure 29:
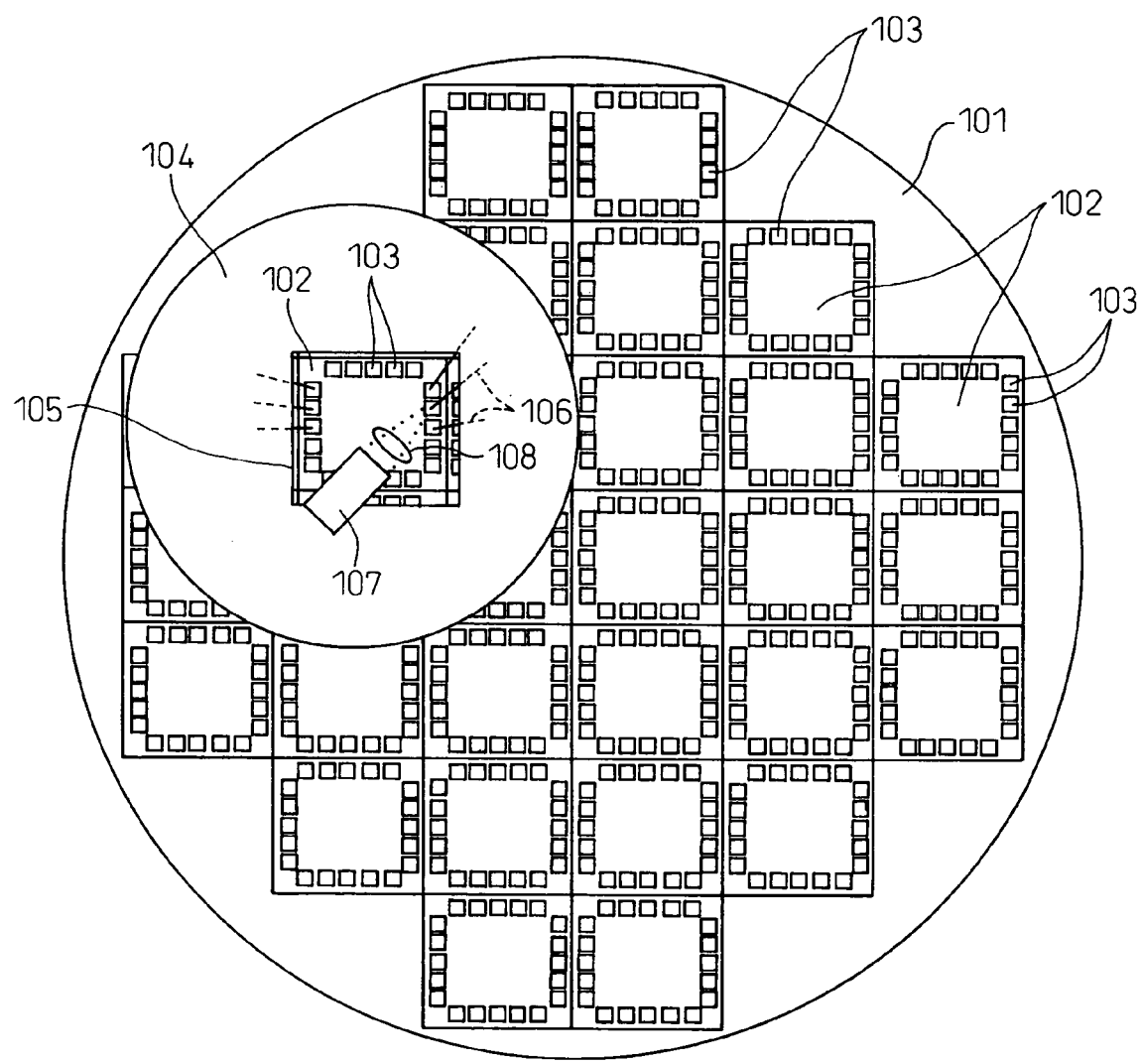
FIG. 29 is a view illustrating an example in which heating using a laser is adapted to terminals of an electronic part in the form of a wafer.
Figure 30:
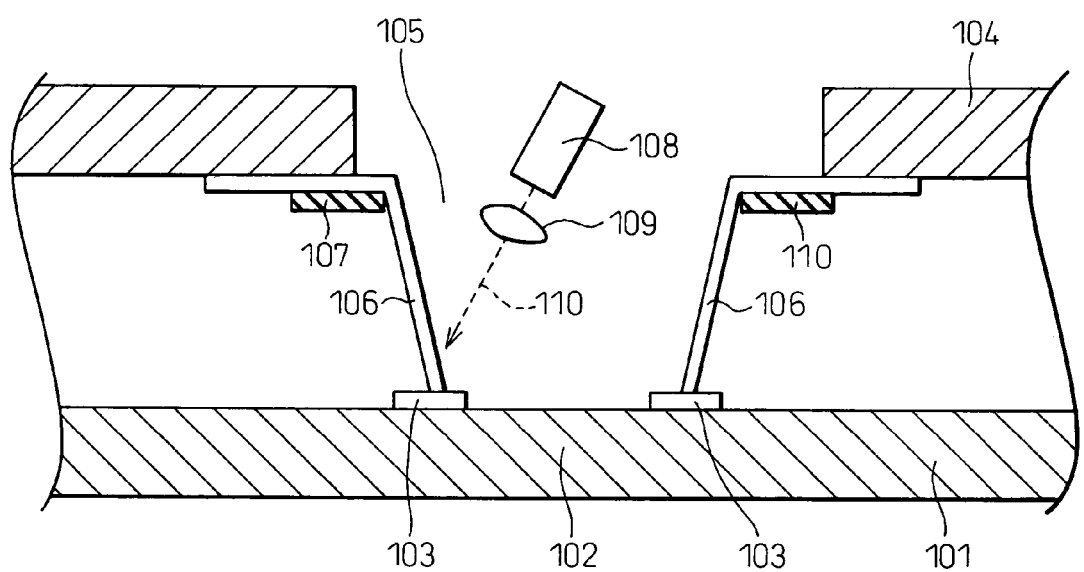
FIG. 30 is a partly enlarged sectional view showing a testing circuit board and the wafer employed in the example shown in FIG. 29.

FIG. 29 schematically shows the positional relationship among a testing circuit board, a semiconductor wafer to be tested, and a heating laser. FIG. 30 shows a state in which laser light is irradiated onto the probe that is formed on the testing circuit board and contacts the terminal of the electronic part formed on the semiconductor wafer.

Figure 31:
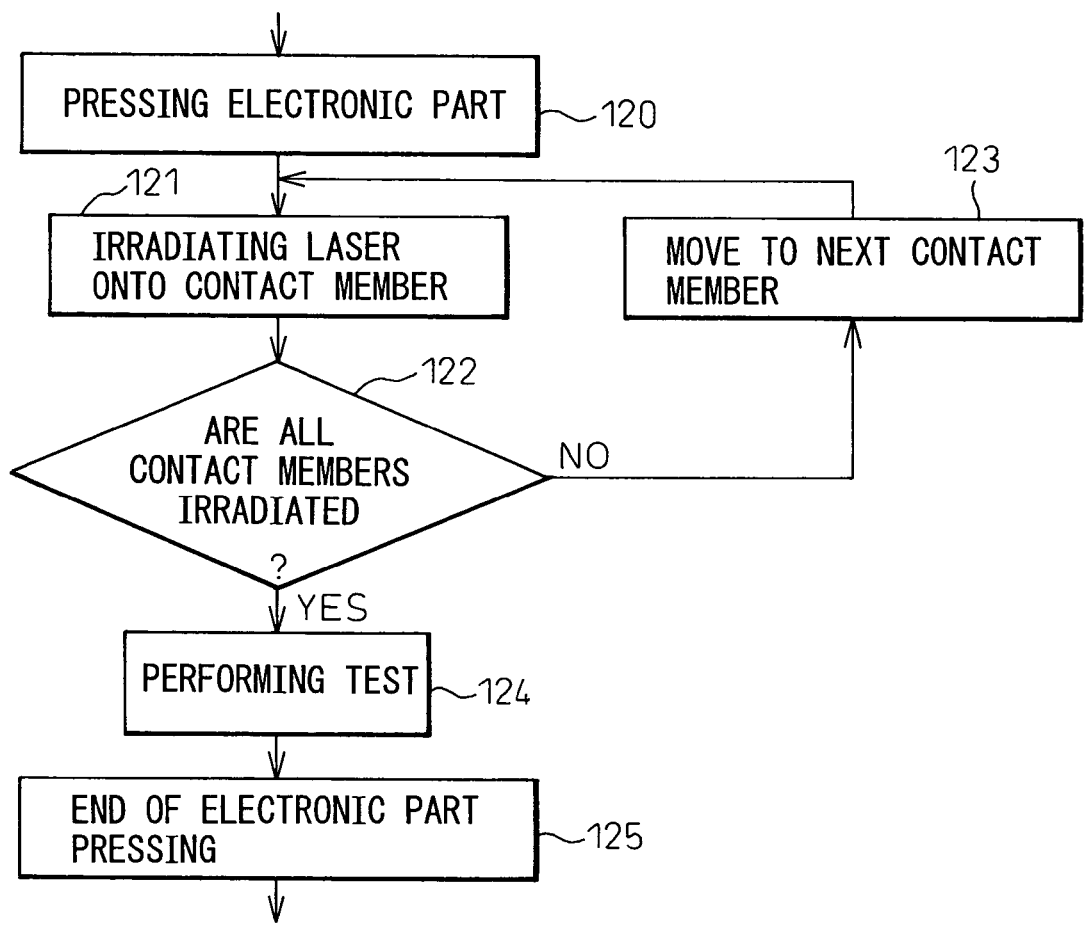
FIG. 31 is a flowchart illustrating the method of using a laser implemented in the example shown in FIG. 29.

FIG. 31 is a flowchart illustrating a heating method based on laser light irradiation.

In FIGS. 29 and 30, a semiconductor wafer 101 has a plurality of semiconductor chip regions serving as electronic parts 102, and each semiconductor chip region includes a plurality of electrode terminals 103.

On the other hand, the testing circuit board 104 has an opening 105 that is larger than one electronic part 102 to be tested. Moreover, the testing circuit board 104 has a plurality of contact members (hereinafter probes) 106 that have ends thereof supported by the testing circuit board 104 and the other ends thereof extending to the opening 105 to contact the electrode terminals 103 of the electronic part to be tested.

One end of the probe 106 is electrically connected to a testing equipment (not shown) via a wiring layer formed in the testing circuit board 104.

A temperature detection element 107 is disposed near the probe 106, and the temperatures of the probe 106 is fed back to a laser control unit (not shown) via the temperature detection element 107.

The testing circuit board 104 is disposed above the semiconductor wafer 101 to be tested.

Moreover, the laser unit 108 is disposed so that laser light 110 emitted by the laser unit 108 and concentrated by a condenser lens 109 can be irradiated onto the tip of the probe 106 through the opening 105.

In the foregoing configuration, the testing circuit board 104 is placed on the semiconductor wafer 101 to be tested, and pressed so that the probes 106 are brought into contact with the electrode terminal 103 of the predetermined electronic part 102.

Thereafter, the laser light 110 is irradiated onto the vicinity of the portion of the probe 106 contacting the electrode terminal 102 in order to heat the probe or raise the temperatures of the probe. Thus, the electrode terminal 103 contacting the probe 106 is locally heated because of thermal conduction (steps 120 and 121 in FIG. 31). The laser light 110 is sequentially irradiated onto the probe 106, and the completion of irradiation is checked (steps 122 and 123).

After the laser light 110 is irradiated to all of the probes 106, heating through laser light irradiation is completed.

If the probes 106 are made of tungsten (W) and have a diameter of 50 μm, laser light whose spot has a diameter of 0.05 mm, whose wavelength is 810 nm, and whose power is 10 W is employed and irradiated for a time of 0.03 sec. Consequently, the electrode terminals 103 are heated up to 180° C.

Thereafter, a predetermined test is performed. After the test is completed, pressing is terminated (steps 124 and 125).

Specifically, the laser light 110 is used to heat the vicinity of the tip of the probe 106, and the surface of the electrode terminal 103 contacting the probe 106 is softened with evolved heat. Thus, the area of the contacting portion of the probe with the electrode terminal is substantially enlarged. Thereafter, a predetermined test is performed.

The present embodiment is adapted to a semiconductor chip having electrode terminals 103 made of aluminum (Al) and shaped to be planar. Alternatively, the present embodiment will be effectively adapted to spherical terminals made of a solder or the like.

As a means for applying energy to probes or any other contact members, heating through electromagnetic induction may be substituted for irradiation of laser light.

Specifically, when the probe is brought into contact with the electrode terminal of the electrode part formed on a wafer in order to test the electrode part, alternating current produced through electromagnetic induction is used to heat the vicinity of the portion of the probe contacting the electrode terminal of a semiconductor part. The surface of the electrode terminal contacting the probe is heated or softened through thermal conduction. Thus, the area of the contacting portion of the probe and the electrode terminal are substantially enlarged.

Figure 32:
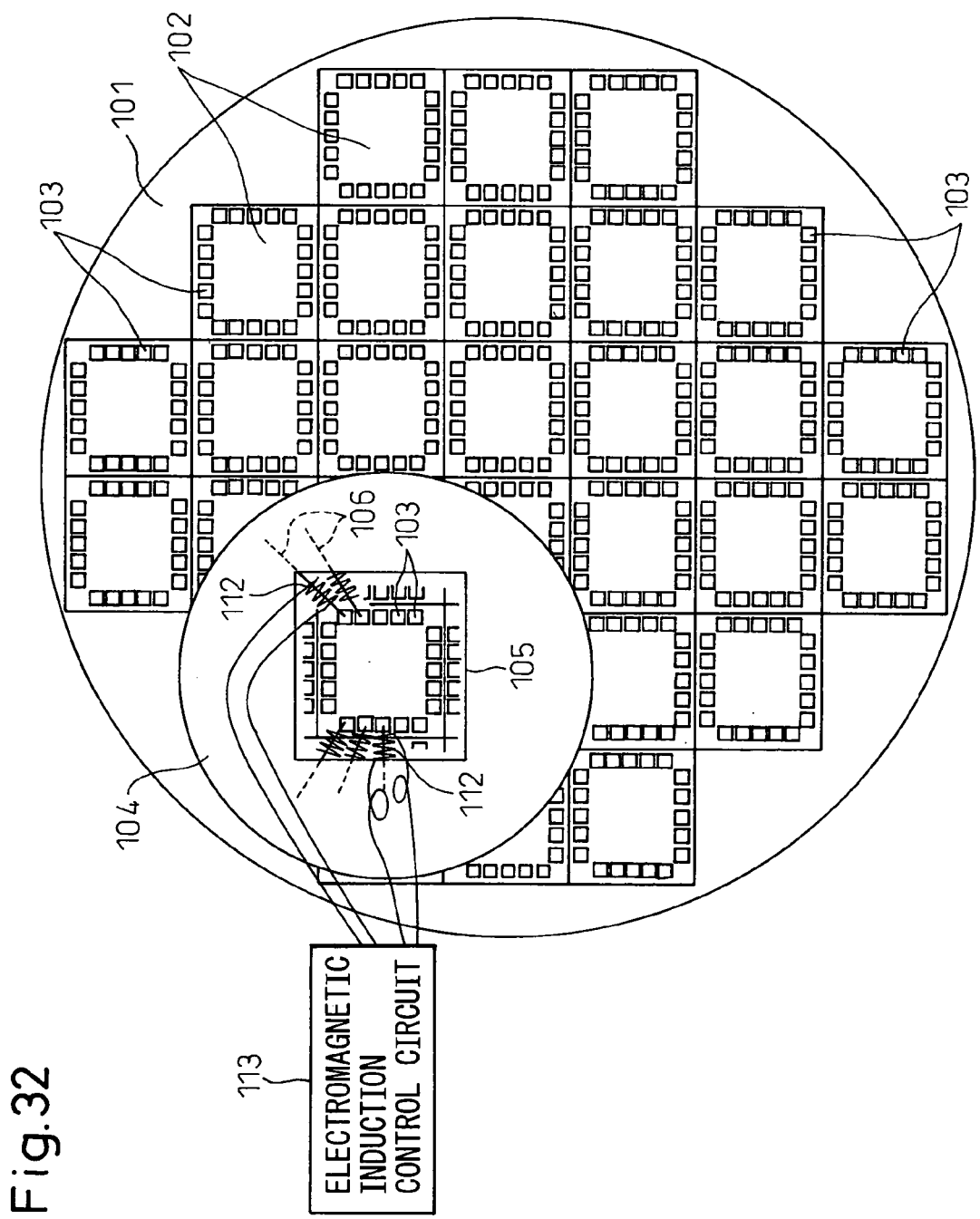
FIG. 32 is a view illustrating an example in which heating through electromagnetic induction is adapted to terminals of an electronic part in the form of a wafer.
Figure 33:
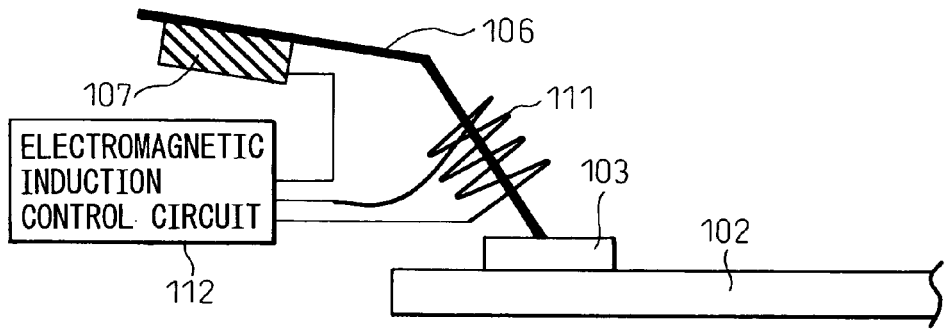
FIG. 33 is a partly enlarged view of the device employed in the example shown in FIG. 32.

FIG. 32 schematically shows the positional relationship among a testing circuit board, a semiconductor wafer to be tested, and electromagnetic induction coils. FIG. 33 shows a state in which the probe having an electromagnetic induction coil wound about the distal portion thereof is brought into contact with the electrode terminal of the electronic part formed on the semiconductor wafer.

Figure 34:
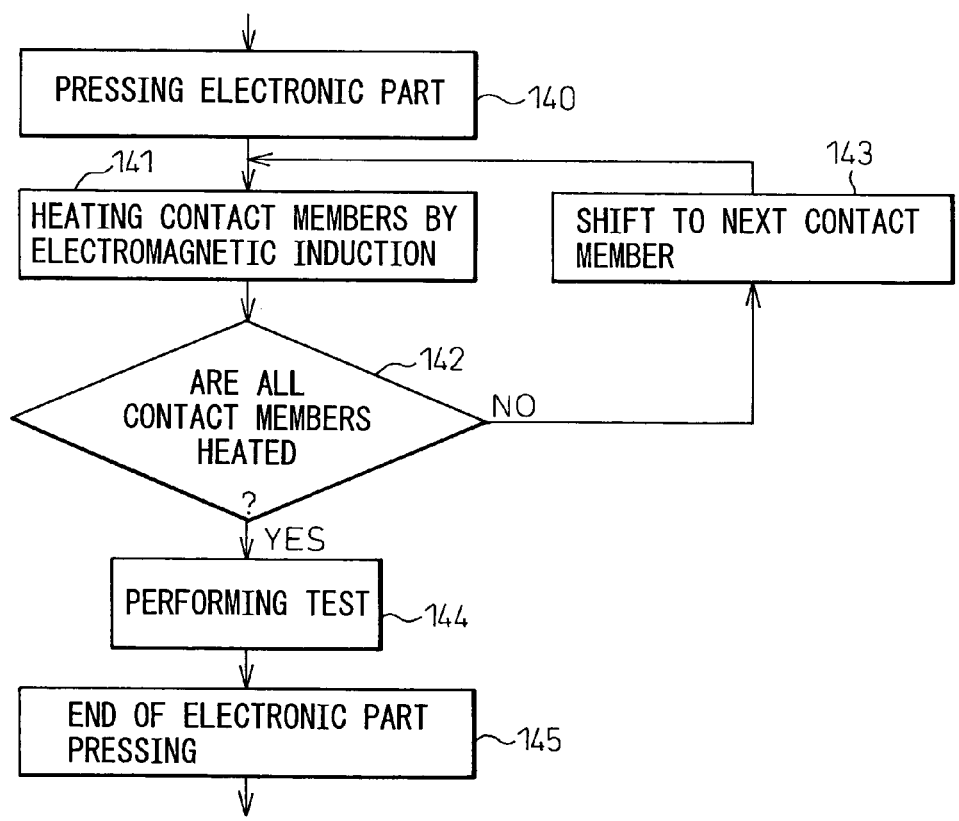
FIG. 34 is a flowchart illustrating the method of utilizing heating through electromagnetic induction implemented in the example shown in FIG. 32.

FIG. 34 is a flowchart illustrating the case in which a method of supplying energy through electromagnetic induction.

In FIGS. 32 and 33, a semiconductor wafer 101 includes a plurality of semiconductor chip regions serving as electronic parts 102, and each semiconductor chip region has a plurality of electrode terminals 103.

On the other hand, the testing circuit board 104 has an opening 105 larger than each of the electronic parts 102 to be tested. The testing circuit board 104 has a plurality of contact members (hereinafter probes) 106 that have ends thereof supported by the testing circuit board 104 and the other ends thereof extending to the opening 105 to contact the electrode terminal 103 of the electronic part to be tested.

One end of the probe is electrically connected to a testing equipment (not shown) via a wiring layer formed in the testing circuit board 104.

The testing circuit board 104 is disposed above the semiconductor wafer 101 to be tested.

Moreover, an electromagnetic induction coil 11 is wound about each of the distal parts of the probes 106. The electromagnetic induction coils 111 are connected to an electromagnetic induction control unit (circuit) 112.

A temperature detection element 107 is disposed near the probe 106. The temperature of the probe 106 is fed back to the electromagnetic induction control unit 113 via the temperature detection element 107, and thus monitored.

In the foregoing configuration, the testing circuit board 104 is placed on the semiconductor wafer 101 to be tested, and pressed so that the probe 106 is brought into contact with the electrode terminal 103 of a predetermined electronic part 102.

Thereafter, high-frequency current whose frequency is equal to or higher than 50 kHz is fed to flow into the electromagnetic induction coils 111. Alternating current is produced near the portion of the probe 106 contacting the electrode terminal 103 through electromagnetic induction, whereby the probe 106 is heated to have the temperature thereof raised. The electrode terminal 103 contacting the probe 106 is locally heated through thermal conduction (steps 140 and 141 in FIG. 34).

High-frequency current is sequentially or simultaneously applied to the electromagnetic induction coils 111 wound about the respective probes 106, and whether or not the application is completed is checked (steps 142 and 143).

Thereafter, a predetermined test is performed on the electronic part 102. After the test is completed, pressing is terminated (steps 144 and 145).

In short, the vicinity of the tip of the probe 106 is heated according to an electromagnetic induction heating method. Evolved heat is used to soften the surface of the electrode terminal 103 contacting the probe 106. Thus, the area of the contacting portion of the probe with the terminal is substantially enlarged. Thereafter, the predetermined test is performed.

The present embodiment is adapted to a semiconductor chip having electrode terminals 103 thereof made of aluminum (Al) and shaped to be planar. The present embodiment will be effectively adapted to spherical terminals made of a solder or the like.

The invention claimed is:

1. An electrical connecting method comprising the steps of:
bringing a contact member connected to an electric circuit into contact with a terminal of an electronic part;
performing a desired processing by feeding current to said terminal via said contact member; and
thereafter separating said contact member from said terminal;
wherein said desired processing is performed in the state that a contacting portion of said terminal with said contact member has been softened by applying energy to said contact member or said terminal only in the vicinity of the portion mutually contacting said contact member and said terminal and applying energy only for a time period such that the contact member establishes a stable electrical connection.

2. The electrical connecting method according to claim 1, wherein said desired processing is a test on said electronic part.

3. The electrical connecting method according to claim 1, wherein said desired processing is writing or erasing of information into said electronic part, or reading of information from said electronic part.

4. The electrical connecting method according to claim 1, wherein said application of energy to said contact is achieved by heating said contact member.

5. The electrical connecting method according to claim 1, wherein said application of energy to said contact is achieved by at least one of heating using a heater, heating through electromagnetic induction, and heating through laser light irradiation.

6. The electrical connecting method according to claim 4, wherein said application of energy to said contact is achieved by at least one of heating using a heater, heating through electromagnetic induction, and heating through laser light irradiation.

7. The electrical connecting method according to claim 1, wherein said application of energy to said terminal of an electronic part is achieved through thermal conduction from said contact member.

8. The electrical connecting method according to claim 4, wherein said application of energy to said terminal of an electronic part is achieved through thermal conduction from said contact member.

9. The electrical connecting method according to claim 5, wherein said application of energy to said terminal of an electronic part is achieved through thermal conduction from said contact member.

10. The electrical connecting method according to claim 1, wherein said application of energy to said terminal of an electronic part is achieved by feeding current through a plurality of contacts which contact said terminal.

* * * * *